US011239290B2

(12) United States Patent
Jang et al.

(10) Patent No.: US 11,239,290 B2
(45) Date of Patent: Feb. 1, 2022

(54) DISPLAY APPARATUS

(71) Applicant: Samsung Display Co., Ltd., Yongin-Si (KR)

(72) Inventors: Kyungsoo Jang, Yongin-si (KR); Jinkoo Chung, Yongin-si (KR); Taekju Jung, Yongin-si (KR); Beohmrock Choi, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/822,079

(22) Filed: Mar. 18, 2020

(65) Prior Publication Data

US 2021/0083019 A1 Mar. 18, 2021

(30) Foreign Application Priority Data

Sep. 16, 2019 (KR) .................. 10-2019-0113523

(51) Int. Cl.
*H01L 27/32* (2006.01)
*H01L 51/52* (2006.01)
*H01L 51/56* (2006.01)

(52) U.S. Cl.
CPC ........ *H01L 27/3234* (2013.01); *H01L 27/326* (2013.01); *H01L 51/5237* (2013.01); *H01L 51/56* (2013.01); *H01L 2251/301* (2013.01)

(58) Field of Classification Search
CPC . H01L 27/3234; H01L 51/5237; H01L 51/56; H01L 27/326; H01L 2251/301; H01L 27/3244–3279; H01L 51/50–56; H01L 2251/50–568; B32B 2457/206
See application file for complete search history.

(56) References Cited

U.S. PATENT DOCUMENTS

| 8,816,331 | B2 | 8/2014 | Choi et al. | |
| 9,263,711 | B2 | 2/2016 | Choi et al. | |
| 9,490,311 | B2 | 11/2016 | Park et al. | |
| 9,646,577 | B2 | 5/2017 | DeLuca | |
| 9,911,941 | B2 | 3/2018 | Choi et al. | |
| 2014/0325402 | A1* | 10/2014 | Jung | G06F 3/04883 715/763 |
| 2018/0097034 | A1 | 4/2018 | Lee et al. | |
| 2018/0182819 | A1* | 6/2018 | Jo | G06F 3/0416 |
| 2019/0058163 | A1* | 2/2019 | Wang | H01L 51/5275 |
| 2019/0189968 | A1 | 6/2019 | Song | |

(Continued)

FOREIGN PATENT DOCUMENTS

KR 10-2012-0052206 A 5/2012
KR 10-2012-0124224 A 11/2012

(Continued)

*Primary Examiner* — Shahed Ahmed
(74) *Attorney, Agent, or Firm* — Innovation Counsel LLP

(57) ABSTRACT

A display apparatus includes a substrate including a display area and a sensor area, the display area including main pixels and the sensor area including auxiliary pixels and a transmission area, a plurality of display elements included in each of the main pixels and each of the auxiliary pixels, a first stack structure overlapping the plurality of display elements, a second stack structure overlapping the transmission area, and a thin film encapsulation layer covering the first stack structure and the second stack structure, wherein the first stack structure has a thickness that is different from a thickness of the second stack structure.

19 Claims, 17 Drawing Sheets

(56) References Cited

U.S. PATENT DOCUMENTS

| | | | |
|---|---|---|---|
| 2019/0196635 A1 | 6/2019 | Park et al. | |
| 2020/0006458 A1* | 1/2020 | Lim | .................... H01L 27/3248 |
| 2020/0194532 A1* | 6/2020 | Lee | .................... H01L 51/0096 |
| 2021/0043705 A1* | 2/2021 | Lim | .................... H01L 27/3258 |
| 2021/0074945 A1* | 3/2021 | Kim | .................... H01L 51/5218 |

FOREIGN PATENT DOCUMENTS

| | | |
|---|---|---|
| KR | 10-2013-0138883 A | 12/2013 |
| KR | 10-2014-0064349 A | 5/2014 |
| KR | 10-2016-0130042 A | 11/2016 |
| KR | 10-2018-0036907 A | 4/2018 |
| KR | 10-2018-0050473 A | 5/2018 |

* cited by examiner

DISPLAY APPARATUS

CROSS-REFERENCE TO RELATED APPLICATION

This application claims the benefits of Korean Patent Applications No. 10-2019-0113523, filed on Sep. 16, 2019, in the Korean Intellectual Property Office, the disclosure of which is incorporated herein in its entirety by reference.

BACKGROUND

1. Field

One or more embodiments relate to a display apparatus.

2. Description of Related Art

A display apparatus may display images by using pixels. A display apparatus may include an infrared ray sensor in a bezel (or a boundary) on a front surface (e.g., a surface displaying images) thereof, and may recognize an object by using the infrared ray sensor.

In addition, as a width of a bezel in a display apparatus is reduced, eyes of a user may be fixed or focused on an image (or a screen of the display apparatus). Recently, researches into a front display technique have been conducted to remove a bezel from a front surface of a display apparatus, to re-locate an infrared ray sensor that was located in the front surface (or bezel), and to display an image on an entire front surface of the display apparatus.

SUMMARY

One or more embodiments provide a display apparatus having a light transmitting portion in a display area.

Additional aspects will be set forth in part in the description which follows and, in part, will be apparent from the description, or may be learned by practice of the presented embodiments of the disclosure.

According to an embodiment, a display apparatus includes a substrate including a display area and a sensor area, the display area including main pixels and the sensor area including auxiliary pixels and a transmission area, a plurality of display elements included in each of the main pixels and each of the auxiliary pixels, a first stack structure overlapping the plurality of display elements, a second stack structure overlapping the transmission area, and a thin film encapsulation layer covering the first stack structure and the second stack structure, wherein the first stack structure has a thickness that is different from a thickness of the second stack structure.

Each of the first stack structure and the second stack structure may include a capping layer and a light extraction layer disposed on the capping layer, the thin film encapsulation layer is disposed on the light extraction layer, and a refractive index of the light extraction layer is less than a refractive index of the capping layer and a refractive index of the first inorganic encapsulation layer.

The capping layer may include a first capping area disposed over the transmission area and a second capping area disposed over the plurality of display elements, and the first capping area may have a thickness greater than a thickness of the second capping area.

The thickness of the first capping area may be greater than or equals to about 1.1 times and less than or equals to 10 times of the thickness of the second capping area.

The light extraction layer may include a first light extraction area disposed over the transmission area and a second light extraction area disposed over the plurality of display elements, and the first light extraction area may have a thickness greater than a thickness of the second light extraction area.

The light extraction layer may include a first light extraction area disposed over the transmission area and a second light extraction area disposed over the plurality of display elements, and the first light extraction area may have a thickness greater than a thickness of the second light extraction area.

The thickness of the first light extraction area may be about twice to about ten times greater than the thickness of the second light extraction area.

A difference between the refractive index of the capping layer and the refractive index of the light extraction layer is greater than or equals to about 0.5, and a difference between the refractive index of the first inorganic encapsulation layer and the refractive index of the light extraction layer may be greater than or equals to about 0.46.

The light extraction layer may include a first light extraction area disposed over the transmission area and a second light extraction area disposed over the plurality of display elements, a thickness of the first capping area may be greater than or equals to about 90 nm and less than or equals to about 150 nm, a thickness of the second capping area may be greater than or equals to about 60 nm and less than or equals to about 85 nm, a thickness of the first light extraction area may be greater than or equals to about 50 nm and less than or equals to about 220 nm, and a thickness of the second light extraction area may be greater than or equals to about 10 nm and less than or equals to about 40 nm.

The capping layer may include a first capping area disposed over the transmission area and a second capping area disposed over the plurality of display elements, the light extraction layer may include a first light extraction area disposed over the first capping area and a second light extraction area disposed over the second capping area, and a refractive index of the capping layer may be greater than or equals to about 1.79 and less than or equals to about 2.2.

The plurality of display elements may include an opposite electrode formed in a single piece to cover the plurality of display elements, and the opposite electrode may include an opening disposed corresponding to the transmission area.

The plurality of display elements may include an opposite electrode formed in a single piece to cover the plurality of display elements, and the opposite electrode may include a first area disposed corresponding to the plurality of display elements and a second area disposed corresponding to the transmission area, the second area having a thickness that is less than a thickness of the first area.

An inorganic insulating layer and an organic insulating layer may be disposed between the substrate and the plurality of display elements, at least one of the inorganic insulating layer and the organic insulating layer may include an opening or a groove disposed corresponding to the transmission area, and the second stack structure may be in the opening or the groove.

The display apparatus may further include an infrared ray sensor on a lower surface of the substrate, the infrared ray sensor being disposed corresponding to the sensor area.

The display apparatus may further include a lower electrode layer below the auxiliary pixel, the lower electrode layer being disposed corresponding to the auxiliary pixel.

According to another embodiment, a display apparatus includes a substrate including a transmission area and a display area surrounding at least part of the transmission area, a plurality of display elements in the display area, a thin film encapsulation layer covering the transmission area and the plurality of display elements, a capping layer disposed between the plurality of display elements and the thin film encapsulation layer to cover the transmission area, and a light extraction layer disposed between the capping layer and the thin film encapsulation layer, wherein at least one of the capping layer and the light extraction layer disposed in a region corresponding to the transmission area has a greater thickness than a region disposed corresponding to the plurality of display elements.

A refractive index of the light extraction layer is less than a refractive index of the capping layer and a refractive index of the first inorganic encapsulation layer.

The capping layer may include a first capping area disposed over the transmission area and a second capping area disposed over the plurality of display elements, and the first capping area may have a thickness greater than a thickness of the second capping area.

The light extraction layer may include a first light extraction area disposed over the transmission area and a second light extraction area disposed over the plurality of display elements, and the first light extraction area may have a thickness greater than a thickness of the second light extraction area.

The plurality of display elements may include an opposite electrode formed in a single piece to cover the plurality of display elements, and the opposite electrode may include a first area disposed corresponding to the plurality of display elements and a second area disposed corresponding to the transmission area, the second area having a thickness less than a thickness of the first area.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
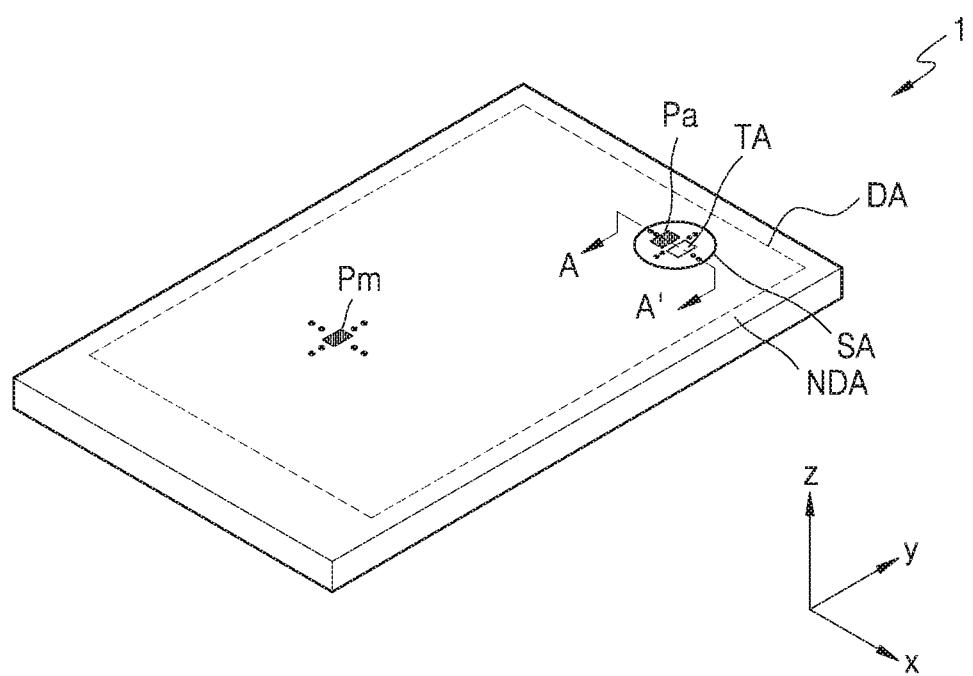
FIG. 1A is a perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The example embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

Figure 1B:
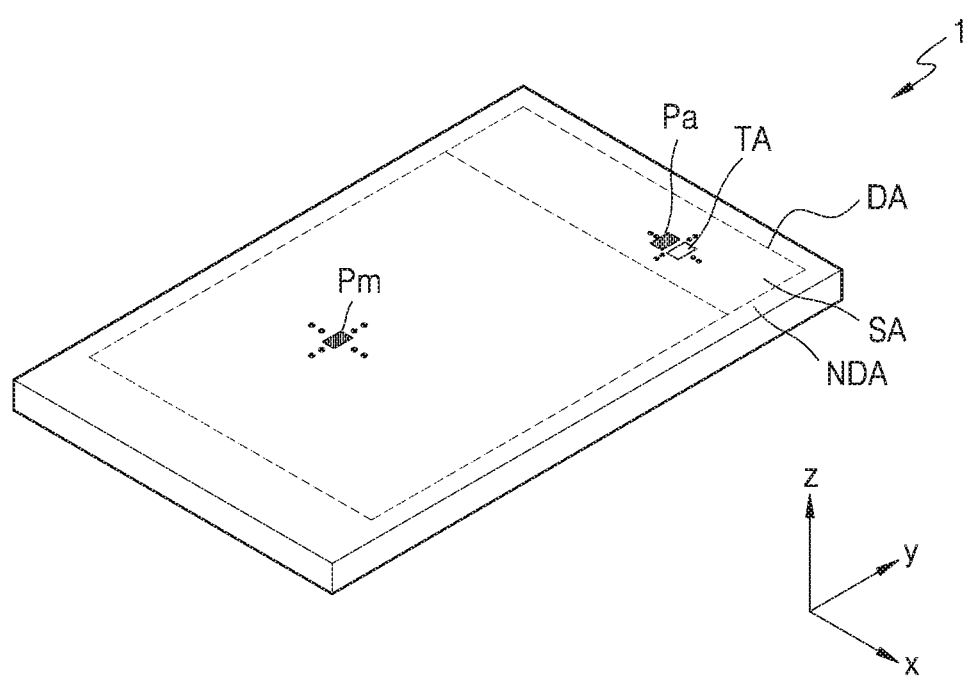
FIG. 1B is a perspective view of a display apparatus according to another embodiment.

FIG. 1A is a perspective view of a display apparatus 1 according to an embodiment. FIG. 1B is a perspective view of a display apparatus 1 according to another embodiment.

Referring to FIG. 1A, the display apparatus 1 includes a display area DA and a non-display area NDA, wherein the display area DA displays images and the non-display area NDA does not display images. The display apparatus 1 may provide a main image via light emitted from a plurality of main pixels Pm arranged in the display area DA.

The display apparatus 1 includes a sensor area SA. The sensor area SA may be an area below which a component such as a sensor using an infrared ray, a visible ray, or sound is arranged. The sensor area SA may include a transmission area TA through which light and/or sound from the component is output to outside or light and/or sound from outside is received. In an embodiment, when the infrared ray passes through the sensor area SA, an infrared ray transmittance of the entire sensor area SA may be greater than or equals to about 15% and less than or equals to 90% according to a structure of the transmission area.

In the embodiment, a plurality of auxiliary pixels Pa may be disposed in the sensor area SA and a predetermined image may be provided by using light emitted from the plurality of auxiliary pixels Pa. The image provided from the sensor area SA is an auxiliary image having a resolution less than that of an image provided by the display area DA. That is, the sensor area SA includes the transmission area TA through which the light and/or sound may pass, and thus, the number of auxiliary pixels Pa per unit area may be less than that of the main pixels Pm per unit area in the display area DA.

The sensor area SA may be at least partially surrounded by the display area DA, and in an embodiment, FIG. 1A shows the sensor area SA entirely surrounded by the display area DA.

In FIG. 1B, like reference numerals as those of FIG. 1A denote the same elements, and detailed descriptions thereof are omitted.

Referring to FIG. 1B, the sensor area SA may be disposed at one side of the display area DA. However, a length of the sensor area SA in a y-direction as shown in FIG. 1B is not restricted to a feature shown in FIG. 1B. That is, the length in the y-direction may variously modified as needed.

Hereinafter, an organic light-emitting display apparatus will be described as an example of the display apparatus 1 according to the embodiment. However, in another embodiment, various types of display apparatuses such as an inorganic light-emitting (EL) display apparatus, a quantum dot light-emitting display apparatus, etc. may be used as the display apparatus 1.

FIG. 1A shows that the sensor area SA is disposed at one side (upper right side) of the display area DA having a square shape. However, in another embodiment, the display area DA may have a circular shape, an elliptical shape, or a polygonal shape such as a triangular shape, a pentagonal shape, etc., and a location of the sensor area SA and the number of sensor area SA may be variously modified.

Figure 2:
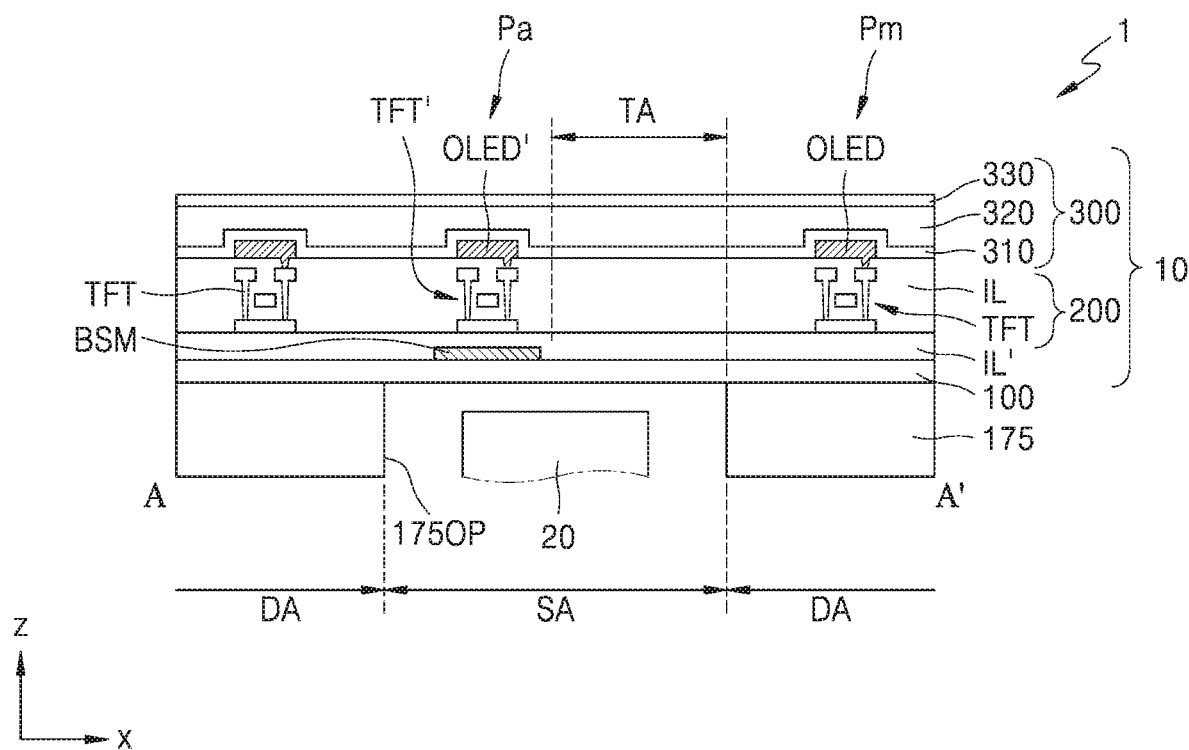
FIG. 2 is a cross-sectional view of a display apparatus according to an embodiment.

FIG. 2 is a cross-sectional view of the display apparatus 1 according to the embodiment, taken along a line A-A' of FIG. 1A.

Referring to FIG. 2, the display apparatus 1 may include a display panel 10 including display elements, and a component 20 disposed corresponding to the sensor area SA.

The display panel 10 may include a substrate 100, a display element layer 200 on the substrate 100, and a thin film encapsulation layer 300 covering the display element layer 200. In addition, the display panel 10 may further include a lower protective film 175 disposed under the substrate 100.

The substrate 100 may include glass or a polymer resin. The substrate 100 including the polymer resin may be flexible, rollable, or bendable. The substrate 100 may have a multi-layered structure including a layer including the polymer resin and an inorganic layer (not shown).

The display element layer 200 may include a circuit layer including a main thin film transistor TFT disposed in the display area DA and an auxiliary thin film transistors TFT' disposed in the sensor area SA, an organic light-emitting diode OLED that is a display element, an insulating layer IL' disposed between the substrate 100 and the thin film transistors TFT and TFT', and an insulating layer IL disposed between the thin film transistors TFT and TFT' and the organic light-emitting diode OLED. The display element layer 200 may include a circuit layer including main and auxiliary thin film transistors TFT and TFT', an organic light-emitting diode OLED that is a display element, and insulating layers IL and IL'.

In addition, the transmission area TA may be located in the sensor area SA in which the auxiliary thin film transistor TFT' and display elements are not arranged. The transmission area TA may be an area through which light/signals emitted from the component 20 or light/signals incident to the component 20 pass.

The component 20 may be disposed to overlap the sensor area SA in a plan view. The component 20 may include an electronic element which emits or receives light or sound. For example, the component 20 may include a sensor receiving light, e.g., an infrared ray sensor, a sensor outputting and sensing light or sound to measure a distance or to sense fingerprints, etc., a small-sized lamp that emits light, or a speaker outputting sound. The electronic element responding to the light may use light of various wavelength bands such as visible light, infrared ray, ultraviolet ray, etc. A plurality of components 20 may be in the sensor area SA. For example, a light-emitting device and a light-receiving device may be provided in a single sensor area SA as the components 20. Alternatively, one component 20 may include a light-emitting portion and a light-receiving portion.

A lower electrode layer BSM may be in the sensor area SA, and the lower electrode layer BSM may overlap the auxiliary pixels Pa in plan view. That is, the lower electrode layer BSM may be disposed correspond to a lower portion of the auxiliary thin film transistor TFT' to overlap the auxiliary thin film transistor TFT'. That is, the lower electrode layer BSM may prevent external light from reaching the auxiliary pixel Pa which includes the auxiliary thin film transistor TFT', etc. For example, the lower electrode layer BSM may prevent the light emitted from the component 20 from reaching the auxiliary pixel Pa. In addition, a constant voltage or a signal is applied to the lower electrode layer BSM to prevent damage to a pixel circuit due to an electrostatic discharge. The lower electrode layer BSM may be formed of a reflective conductive material, for example, metal.

The thin film encapsulation layer 300 may include at least one inorganic encapsulation layer and at least one organic encapsulation layer. In this regard, referring to FIG. 2, the thin film encapsulation layer 300 may include first and second inorganic encapsulation layers 310 and 330, respectively, and an organic encapsulation layer 320 disposed between the first and second inorganic encapsulation layers 310 and 330.

The organic encapsulation layer 320 may include a polymer-based material. For example, the organic encapsulation layer 320 may include polyethylene terephthalate, polyethylene naphthalate, polycarbonate, polyimide, polyethylene sulfonate, polyoxymethylene, polyarylate, hexamethyl disiloxane, an acryl-based resin (e.g., polymethyl methacrylate, polyacrylic acid, etc.), or a combination thereof.

The first and second inorganic encapsulation layers 310 and 330 may include one or more inorganic insulating materials selected from the group consisting of aluminum oxide, titanium oxide, tantalum oxide, hafnium oxide, zinc oxide, silicon oxide, silicon nitride, and silicon oxynitride. The second inorganic encapsulation layer 330 may cover the organic encapsulation layer 320 and may include silicon oxide, silicon nitride, and/or silicon oxynitride. The second inorganic encapsulation layer 330 is deposited at an edge area of the display apparatus 1 to be in direct contact with the first inorganic encapsulation layer 310 so as not to expose the organic encapsulation layer 320 to outside of the display apparatus 1.

The lower protective film 175 is attached to a lower portion of the substrate 100 to protect and support the substrate 100. The lower protective film 175 may include an opening 1750P corresponding to the sensor area SA. Since the lower protective film 175 includes the opening 1750P, a light transmittance of the sensor area SA may be improved. The lower protective film 175 may include polyethylene terephthalate or polyimide. In addition, when the substrate 100 includes glass, the lower protective film 175 may be omitted.

An area of the sensor area SA may be greater than that of a region where the component 20 is arranged. Accordingly, an area of the opening 1750P included in the lower protective film 175 may not be equal to that of the sensor area SA. For example, the area of the opening 1750P may be less than that of the sensor area SA.

Although not shown in the drawings, components such as an input sensor for sensing a touch input, an anti-reflection layer including a polarizer and a retarder, or a color filter and a black matrix, a transparent window, etc. may be further arranged on the display panel 10.

In addition, in the embodiment, the thin film encapsulation layer 300 is used for protecting the display element layer 200, but in another embodiment, a sealing substrate that is bonded to the substrate 100 via a sealant or frit may be used as an encapsulation substrate for the display element layer 200.

Figure 3:
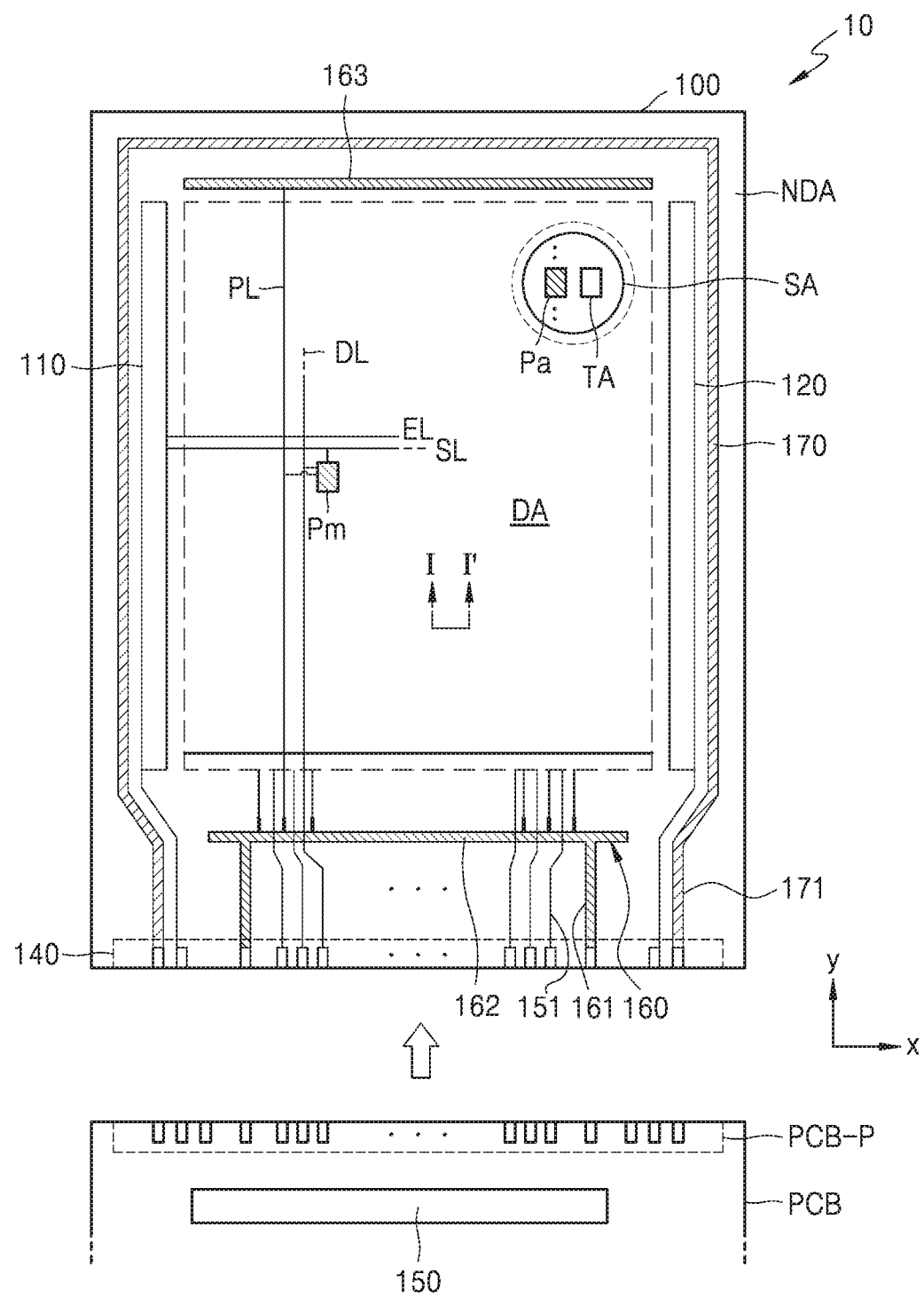
FIG. 3 is a plan view of a display panel according to an embodiment.

FIG. 3 is a plan view of the display panel 10 according to an embodiment.

Referring to FIG. 3, the display panel 10 is includes the plurality of main pixels Pm disposed in the display area DA. Each of the main pixels Pm may include a display element such as an organic light-emitting diode. Each of the main pixels Pm may emit light, e.g., red light, green light, blue light, or white light, via the organic light-emitting diode. In the specification, the main pixel Pm may be understood as a pixel emitting red light, green light, blue light, or white light, as described above. The display area DA is covered by the encapsulation layer described above with reference to FIG. 2, so as to be protected against external air or moisture.

The sensor area SA may be in the display area DA and the plurality of auxiliary pixels Pa are disposed in the sensor area SA. Each of the auxiliary pixels Pa may include a display element such as an organic light-emitting diode. Each of the auxiliary pixels Pa may emit light, e.g., red light, green light, blue light, or white light, via the organic light-emitting diode. In the specification, the auxiliary pixel Pa may be understood as a pixel emitting red light, green light, blue light, or white light, as described above. In addition, the sensor area SA includes the transmission area TA disposed between the auxiliary pixels Pa.

In an embodiment, one main pixel Pm and one auxiliary pixel Pa may include same pixel circuits. However, one or more embodiments are not limited thereto. That is, the pixel circuit included in the main pixel Pm and the pixel circuit included in the auxiliary pixel Pa may be different from each other.

The sensor area SA includes the transmission area TA, and thus, a resolution of the sensor area SA may be less than that of the display area DA. For example, the resolution of the sensor area SA may be half the resolution of the display area DA. In some embodiments, the resolution of the display area DA may be 400 ppi or greater, and the resolution of the sensor area SA may be about 200 ppi or greater.

Each of the main and auxiliary pixels Pm and Pa may be electrically connected to external circuits in the non-display area NDA. In the non-display area NDA, a first scan driving circuit 110, a second scan driving circuit 120, a terminal 140, a data driving circuit 150, a first power supply line 160, and a second power supply line 170 may be arranged.

The first scan driving circuit 110 may provide each of the main and auxiliary pixels Pm and Pa with a scan signal via a scan line SL. The first scan driving circuit 110 may provide each pixel with an emission control signal via an emission control line EL. The second scan driving circuit 120 may be in parallel with the first scan driving circuit 110 with the display area DA disposed therebetween. Some of the main and auxiliary pixels Pm and Pa in the display area DA may be electrically connected to the first scan driving circuit 110, and the other pixels Pm and Pa may be connected to the second scan driving circuit 120. In another embodiment, the second scan driving circuit 120 may be omitted.

The terminal 140 may be disposed at one side of the substrate 100. The terminal 140 may not be covered by an insulating layer but is exposed, and may be electrically connected to a printed circuit board PCB.

A terminal PCB-P of the printed circuit board PCB may be electrically connected to a terminal of the display panel 10. The printed circuit board PCB may transfer control signals or power from a controller (not shown) to the display panel 10. Control signals generated by the controller may be respectively transferred to the first and second scan driving circuits 110 and 120 via the printed circuit board PCB. The controller may provide the first and second powers to the display panel 10 through the first and second power supply lines 160 and 170 respectively. The first power having a first power voltage ELVDD and the second power having a second power voltage ELVSS are provided to the display panel 10 via first and second connecting lines 161 and 171. The first power voltage ELVDD is supplied to each of the main and auxiliary pixels Pm and Pa via a driving voltage line PL connected to the first power supply line 160, and the second power voltage ELVSS may be provided to an opposite electrode of each of the main and auxiliary pixels Pm and Pa connected to the second power supply line 170.

The data driving circuit 150 is electrically connected to a data line DL. A data signal of the data driving circuit 150 may be provided to each of the main and auxiliary pixels Pm and Pa via a connecting line 151 connected to the terminal 140 and the data line DL connected to the connecting line 151. Although FIG. 3 shows that the data driving circuit 150 is disposed on the printed circuit board PCB, the data driving circuit 150 may be disposed on the substrate 100 in another embodiment. For example, the data driving circuit 150 may be disposed between the terminal 140 and the first power supply line 160, or between the terminal 140 and the one side of the substrate 100.

The first power supply line 160 may include a first sub-line 162 and a second sub-line 163 that extend in parallel with each other in an X-direction with the display area DA disposed therebetween. The second power supply line 170 has a loop shape having an opening to partially surround the display area DA.

Figure 4:
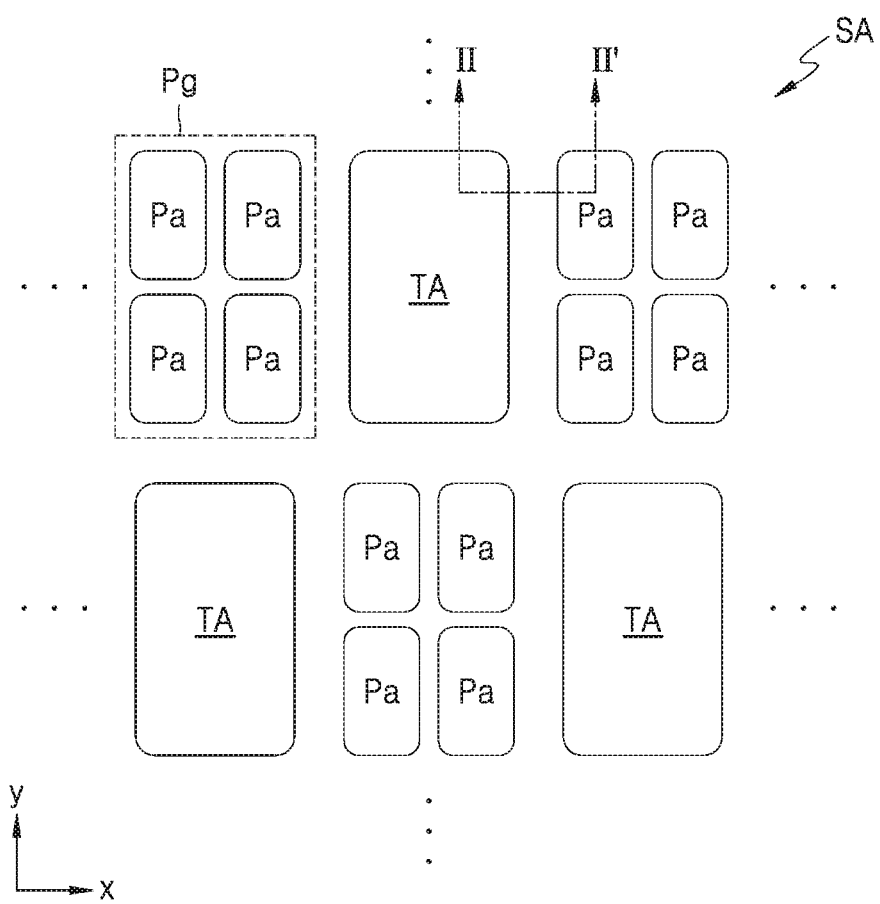
FIG. 4 is a plan view partially showing a sensor region of FIG. 3.
Figure 5:
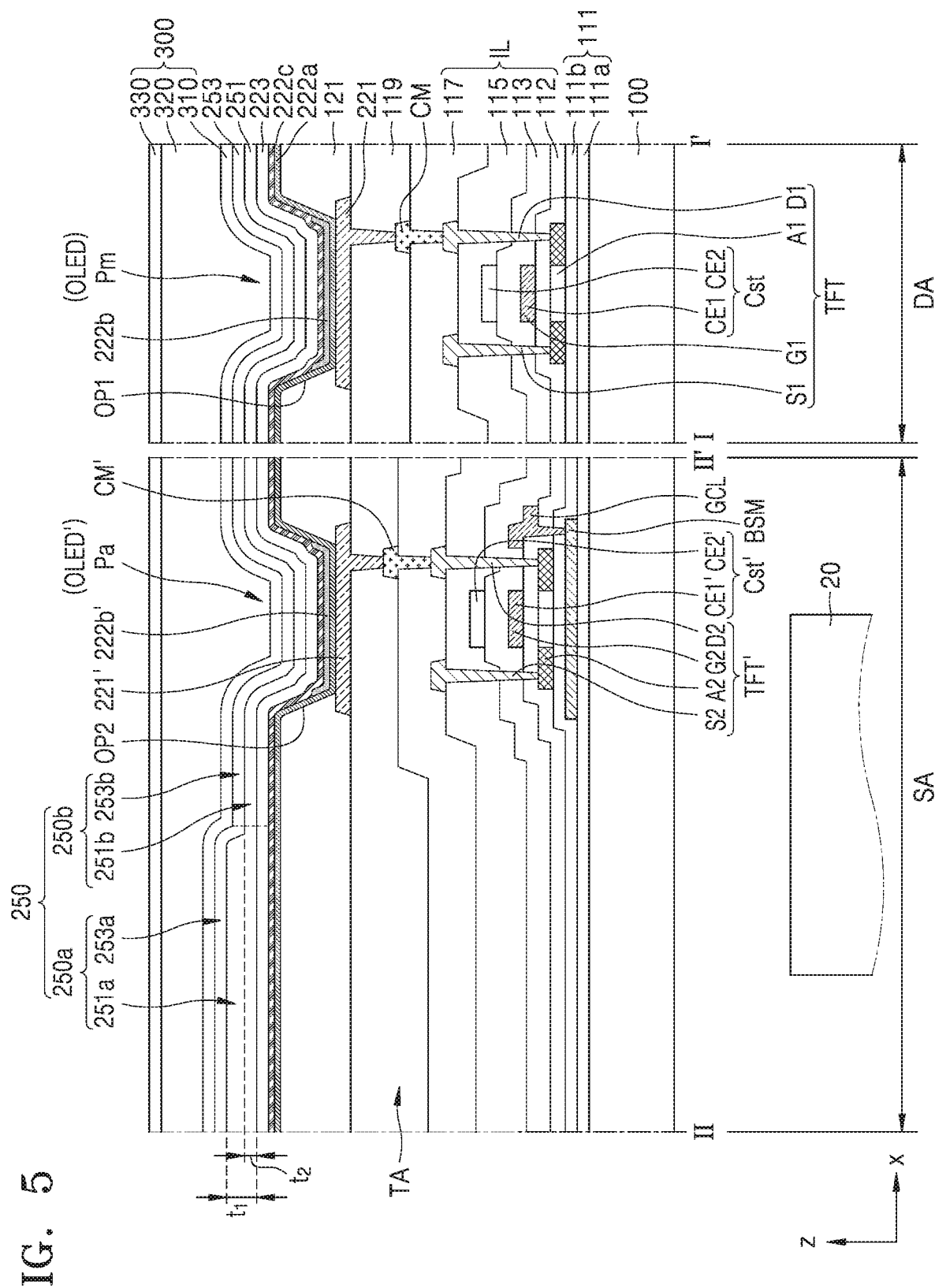
FIG. 5 is a cross-sectional view of a display apparatus according to an embodiment.

FIG. 4 is a plan view partially showing the sensor area SA of FIG. 3, and FIG. 5 is a cross-sectional view taken along line I-I' of FIG. 3 and line II-IT of FIG. 4.

Referring to FIG. 4, the auxiliary pixels Pa and the transmission areas TA are in the sensor area SA of the display apparatus according to an embodiment. Predetermined number of auxiliary pixels Pa may be continuously arranged to form one pixel group Pg.

The pixel group Pg may include at least one auxiliary pixel Pa. In an embodiment, one pixel group Pg may include four auxiliary pixels Pa arranged in two columns and two rows as shown in FIG. 4. However, in another embodiment, the number of the auxiliary pixels Pa and the arrangement of the auxiliary pixels Pa included in one pixel group Pg may be variously modified. For example, one pixel group Pg may include three auxiliary pixels Pa arranged in a row.

The transmission area TA has a high light transmittance than the auxiliary pixels Pa because a display element is not arranged in the transmission area TA, and a plurality of transmission areas TA may be included in the sensor area SA. The transmission areas TA may be arranged alternately with the pixel groups Pg along a first direction (x-direction) and/or a second direction (y-direction). Alternatively, the transmission areas TA may be arranged to surround the pixel group Pg. Alternatively, the auxiliary pixels Pa may be arranged to surround the transmission area TA.

Referring to FIG. 5, the display apparatus according to the embodiment includes the display area DA and the sensor area SA. The main pixels Pm are disposed in the display area DA, and the auxiliary pixels Pa and the transmission area TA are disposed in the sensor area SA.

Each of the main pixels Pm may include the main thin film transistor TFT, a main storage capacitor Cst, and the main organic light-emitting diode OLED. Each of the auxiliary pixels Pa may include an auxiliary thin film transistor TFT', an auxiliary storage capacitor Cst', and an auxiliary organic light-emitting diode OLED'.

The component 20 may be disposed under the sensor area SA to overlap the sensor area SA. The component 20 may include an infrared ray (IR) sensor for emitting/receiving the infrared ray. Since the transmission area TA is in the sensor area SA, IR signals emitted from/incident onto the component 20 may pass through the sensor area SA. For example, the light emitted from the component 20 may proceed in a z-direction through the transmission area TA, and light incident onto the component 20 from the outside of the display apparatus may proceed in a −z-direction through the transmission area TA.

Hereinafter, a structure in which elements included in the display apparatus according to the embodiment will be described below.

The substrate 100 may include glass or a polymer resin. The polymer resin may include polyethersulfone, polyacrylate, polyetherimide, polyethylene n naphthalate, polyethylene terephthalate, polyphenylene sulfide, polyarylate, polyimide, polycarbonate, cellulose acetate propionate, etc. The substrate 100 including the polymer resin may be flexible, rollable, or bendable. The substrate 100 may have a multi-layered structure including a layer including the polymer resin and an inorganic layer (not shown).

A buffer layer 111 is disposed on the substrate 100 to reduce or block infiltration of impurities, moisture, or external air from a lower portion of the substrate 100, and to provide a flat surface on the substrate 100. The buffer layer 111 may include an inorganic material such as an oxide or a nitride, an organic material, or an inorganic-organic composite material, and may have a single-layered or multi-layered structure including the inorganic material and the organic material. A barrier layer (not shown) for preventing infiltration of external air may be further provided between the substrate 100 and the buffer layer 111. In some embodiments, the buffer layer 111 may include silicon oxide ($SiO_2$) or silicon nitride ($SiN_x$). The buffer layer 111 may include a first buffer layer 111a and a second buffer layer 111b laminated on the first buffer layer 111a.

In the sensor area SA, the lower electrode layer BSM may be disposed between the first buffer layer 111a and the second buffer layer 111b. In another embodiment, the lower electrode BSM may be disposed between the substrate 100 and the first buffer layer 111a. The lower electrode layer BSM is under the auxiliary thin film transistor TFT' to completely overlap the auxiliary thin film transistor TFT' in a plan view, and may prevent degradation of the auxiliary thin film transistor TFT' due to the light emitted from the component 20.

Also, the lower electrode layer BSM may be connected to a wiring GCL that is in another layer via a contact hole. The lower electrode layer BSM may receive a constant voltage or a signal supplied from the wiring GCL. For example, the lower electrode layer BSM may receive a driving voltage ELVDD (first power voltage ELVDD) or a scan signal. Since the lower electrode layer BSM is provided with the constant voltage or signal, a probability of generating an electrostatic discharge may be noticeably reduced. The lower electrode layer BSM may include aluminum (Al), platinum (Pt), palladium (Pd), argentum (Ag), magnesium (Mg), aurum (Au), neodymium (Nd), iridium (Ir), chrome (Cr), nickel (Ni), calcium (Ca), molybdenum (Mo), titanium (Ti), tungsten (W), and/or copper (Cu). The lower electrode layer BSM may have a single-layered or a multi-layered structure including the above stated materials.

The main thin film transistor TFT and the auxiliary thin film transistor TFT' may be disposed on the buffer layer 111. The main thin film transistor TFT includes a first semiconductor layer A1, a first gate electrode G1, a first source electrode S1, and a first drain electrode D1, and the auxiliary thin film transistor TFT' includes a second semiconductor layer A2, a second gate electrode G2, a second source electrode S2, and a second drain electrode D2. The main thin film transistor TFT is connected to the main organic light-emitting diode OLED of the display area DA to drive the main organic light-emitting diode OLED. The auxiliary thin film transistor TFT' is connected to the auxiliary organic light-emitting diode OLED' of the sensor area SA to drive the auxiliary thin film transistor OLED'.

The first semiconductor layer A1 and the second semiconductor layer A2 are on the buffer layer 111, and may include polysilicon. In another embodiment, the first semiconductor layer A1 and the second semiconductor layer A2 may include amorphous silicon. In another embodiment, the first semiconductor layer A1 and the second semiconductor layer A2 may each include an oxide of at least one selected from the group consisting of indium (In), gallium (Ga), stannum (Sn), zirconium (Zr), vanadium (V), hafnium (Hf), cadmium (Cd), germanium (Ge), chrome (Cr), titanium (Ti), and zinc (Zn). The first and second semiconductor layers A1 and A2 may each include a channel region, and a source region and a drain region doped with impurities.

The first semiconductor layer A1 may overlap the lower electrode BSM with the second buffer layer 111b disposed therebetween. In an embodiment, a width and a length of the first semiconductor layer A1 may be less than those of the lower electrode layer BSM, and thus, the first semiconductor layer A1 may entirely overlap with the lower electrode layer BSM when it is projected from a direction perpendicular to the substrate 100.

A first gate insulating layer 112 may cover the first semiconductor layer A1 and the second semiconductor layer A2. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first gate insulating layer 112 may have a single-layered or a multi-layered structure including the inorganic insulating material.

The first gate electrode G1 and the second gate electrode G2 may be disposed on the first gate insulating layer 112 so as to respectively overlap the first semiconductor layer A1 and the second semiconductor layer A2. The first gate electrode G1 and the second gate electrode G2 include molybdenum (Mo), aluminum (Al), copper (Cu), titanium (Ti), etc., and may each have a single-layered or a multi-layered structure. For example, the first gate electrode G1 and the second gate electrode G2 may each have a single-layered structure including Mo.

A second gate insulating layer 113 may cover the first gate electrode G1 and the second gate electrode G2. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second gate insulating layer 113 may have a single-layered or a multi-layered structure including the inorganic insulating material.

A first upper electrode CE2 of the main storage capacitor Cst and a second upper electrode CE2' of the auxiliary storage capacitor Cst' may be disposed on the second gate insulating layer 113.

In the display area DA, the first upper electrode CE2 may overlap the first gate electrode G1 arranged thereunder. The first gate electrode G1 and the first upper electrode CE2 overlapping each other with the second gate insulating layer 113 interposed therebetween may form the main storage capacitor Cst. The first gate electrode G1 may be a first lower electrode CE1 of the main storage capacitor Cst.

In the sensor area SA, the second upper electrode CE2' may overlap the second gate electrode G2 arranged thereunder. The second gate electrode G2 and the second upper electrode CE2' overlapping each other with the second gate insulating layer 113 interposed therebetween may configure the auxiliary storage capacitor Cst'. The second gate electrode G2 may be a second lower electrode CE1' of the auxiliary storage capacitor Cst'.

The first upper electrode CE2 and the second upper electrode CE2' may each include, for example, Al, Pt, Pd, Ag, Mg, Au, Ni, Nd, Ir, Cr, Ca, Mo, Ti, W, and/or Cu, and may have a single-layered or multi-layered structure.

A first interlayer insulating layer 115 may cover the first upper electrode CE2 and the second upper electrode CE2'. The first interlayer insulating layer 115 may include an insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The first and second source electrodes S1 and S2 and the first and second drain electrodes D1 and D2 are disposed on the first interlayer insulating layer 115. The source electrodes S1 and S2 and the drain electrodes D1 and D2 may each include a conductive material including Mo, Al, Cu, Ti, etc., and may have a single-layered or multi-layered structure including the above-stated materials. For example, the source electrodes S1 and S2 and the drain electrode D1 and D2 may each have a multi-layered structure including Ti/Al/Ti.

A second interlayer insulating layer 117 may cover the source electrodes S1 and S2 and the drain electrodes D1 and D2. The second interlayer insulating layer 117 may include an insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

A main connecting metal CM and an auxiliary connecting metal CM' may be disposed on the second interlayer insulating layer 117. The main connecting metal CM and an auxiliary connecting metal CM' may be electrically connected to the main thin film transistor TFT and the auxiliary thin film transistor TFT' by respectively contacting the first drain electrode D1 of the main thin film transistor TFT and the second drain electrode D2 of the auxiliary thin film transistor TFT' via openings formed in the second interlayer insulating layer 117.

A wiring (not shown) including the same material as those of the main connecting metal CM and the auxiliary connecting metal CM' and apart from the main and auxiliary connecting metals CM and CM' may be disposed on the second interlayer insulating layer 117.

The planarization layer 119 may be disposed on the main connecting metal CM and the auxiliary connecting metal CM'. The planarization layer 119 may have a flat upper surface so that a first pixel electrode 221 and a second pixel electrode 221' that will be formed thereon may have planarized upper surfaces.

The planarization layer 119 may include a single-layered or multi-layered structure including an organic material and/or an inorganic material. The planarization layer 119 may include a general universal polymer (benzocyclobutene (BCB), polyimide, hexamethyldisiloxane (HMDSO), polymethylmethacrylate, or polystyrene), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. The planarization layer 119 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), etc. After arranging the planarization layer 119, a chemical and mechanical polishing may be performed to provide a flat upper surface when the upper surface has an uneven surface.

An opening for exposing the main connecting metal CM is in the planarization layer 119, and the first pixel electrode 221 may be electrically connected to the main thin film transistor TFT by contacting the main connecting metal CM via the opening.

Also, the planarization layer 119 includes the opening exposing the auxiliary connecting metal CM', and thus the second pixel electrode 221' may be electrically connected to the auxiliary thin film transistor TFT' by contacting the auxiliary connecting metal CM' via the opening.

The first pixel electrode 221 and the second pixel electrode 221' may each include conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the first pixel electrode 221 and the second pixel electrode 221' may each include a reflective layer including Ag, Mg, Al, Pt, Pd, Au, Ni, Nd, Jr, Cr, or a compound thereof. In another embodiment, the first pixel electrode 221 and the second pixel electrode 221' may further include a layer including ITO, IZO, ZnO, or $In_2O_3$ disposed on/under the reflective layer. In some embodiments, the first pixel electrode 221 and the second pixel electrode 221' may have a laminated structure including ITO/Ag/ITO.

A pixel defining layer 121 may cover boundaries of each of the first pixel electrode 221 and the second pixel electrode 221'. The pixel defining layer 121 overlaps each of the first pixel electrode 221 and the second pixel electrode 221', and includes a first opening OP1 and a second opening OP2 that define a light emission region of the pixel. The pixel defining layer 121 increases a distance between an edge of the first and second pixel electrodes 221 and 221' and an opposite electrode 223 disposed on the first and second pixel electrodes 221 and 221' to prevent generation of arc at the edge of the first and second pixel electrodes 221 and 221'. The pixel defining layer 121 may include an organic insulating material such as polyimide, polyamide, an acrylic resin, benzocyclobutene, hexamethyldisiloxane (HMDSO), and a phenol resin, and may be obtained by a spin coating, etc.

A first functional layer 222a covers the pixel defining layer 121 and exposed surfaces of the first and second pixel electrodes 221 and 221'. The first functional layer 222a may have a single-layered or multi-layered structure. The first functional layer 222a may include a hole transport layer (HTL) having a single-layered structure. Alternatively, the first functional layer 222a may include a hole injection layer (HIL) and the HTL. The first functional layer 222a may be integrally formed to correspond to the main pixels Pm and the auxiliary pixels Pa included in the display area DA and the sensor area SA.

A first emission layer 222b and a second emission layer 222b' are disposed on the first functional layer 222a to correspond respectively to the first pixel electrode 221 and the second pixel electrode 221'. The first emission layer 222b and the second emission layer 222b' may respectively include a polymer material or a low-molecular material, and may emit red light, green light, blue light, or white light.

A second functional layer 222c may be on the first emission layer 222b and the second emission layer 222b'. The second functional layer 222c may have a single-layered or multi-layered structure. The second functional layer 222c may include an electron transport layer (ETL) and/or an electron injection layer (EIL). The second functional layer 222c may be integrally formed to correspond to the main pixels Pm and the auxiliary pixels Pa included in the display area DA and the sensor area SA. The first functional layer 222a and/or the second functional layer 222c may be omitted.

The opposite electrode 223 is disposed on the second functional layer 222c. The opposite electrode 223 may include a conductive material having a low work function. For example, the opposite electrode 223 may include a (semi-)transparent layer including Ag, Mg, Al, Pt, Pd, Au, Ni, Nd, Ir, Cr, Li, Ca, or an alloy thereof. Alternatively, the opposite electrode 223 may further include a layer including ITO, IZO, ZnO, or $In_2O_3$ disposed on the (semi-)transparent layer including the above material. The opposite electrode 223 may be integrally formed to correspond to the main pixels Pm and the auxiliary pixels Pa respectively included in the display area DA and the sensor area SA.

Layers from the first pixel electrode 221 to the opposite electrode 223 in the display area DA may configure the main organic light-emitting diode OLED. Layers from the second pixel electrode 221' to the opposite electrode 223 in the sensor area SA may configure the auxiliary organic light-emitting diode OLED'.

In the embodiment, a stack structure 250 may be disposed over the opposite electrode 223 for improving a light extraction efficiency. The stack structure 250 may include a capping layer 251 and a light extraction layer 253. The stack structure 250 may include a first stack structure 250b corresponding to the plurality of display elements included in the main pixel Pm and the auxiliary pixel Pa, and a second stack structure 250a corresponding to the transmission area TA. In the embodiment, the first stack structure 250b has a thickness that is different from a thickness of the second stack structure 250a.

Since the display apparatus 1 includes a plurality of layers, the light emitted from the emission layer or the component 20 has to pass through the plurality of layers over the emission layer or the component 20 to be emitted to outside the display apparatus 1. In this case, a large amount of light may be extinguished while the light generated by the emission layer passes through the plurality of layers over the emission layer.

Here, one of significant factors of light extinction may include total reflection at an interface between adjacent layers among the plurality of layers. In order to prevent the light extinction due to the total reflection, a method of preventing the total reflection from occurring at an interface between the adjacent layers may be applied. To this end, a refractive index and a thickness of each layer may be adjusted.

For example, a refractive index and a thickness of each layer may be designed taking into account following equation.

$$n*d=\lambda/4$$

Here, n denotes a refractive index, d denotes a thickness, and λ denotes a median value of an emitting or transmitting wavelength band.

In the embodiment, a refractive index and/or a thickness of the stack structure 250 over the opposite electrode 223 may be designed to increase light extraction of visible ray with respect to the main pixels Pm and the auxiliary pixels Pa and to increase light extraction of infrared ray with respect to the transmission area TA.

Referring to FIG. 5, the capping layer 251 may be disposed on the opposite electrode 223. The capping layer 251 may cover the main pixels Pm, the auxiliary pixels Pa, and the transmission area TA. Also, in the capping layer 251, a thickness $t_1$ of a first capping area 251a over the transmission area TA may be different from a thickness $t_2$ of a second capping area 251b over the display element in the sensor area SA and the display area DA, that is, the organic light-emitting diode OLED. The light passing through the main pixels Pm and the auxiliary pixels Pa may mainly include visible ray and the light passing through the transmission area TA may mainly include infrared ray.

Therefore, in the embodiment, the stack structure capable of improving transmittance of visible ray is provided in the region where the main pixels Pm and the auxiliary pixels Pa are arranged, and the stack structure capable of improving the transmittance of the infrared ray is provided in the region where the transmission area TA is arranged.

Accordingly, in the embodiment, the thickness of the capping layer 251 may not be consistent throughout the display area DA and the sensor area SA.

In the embodiment, a thickness denotes a vertical distance from a lower surface to an upper surface of a layer.

In an embodiment, the thickness $t_1$ of the first capping area 251a over the transmission area TA may be greater than the thickness $t_2$ of the second capping area 251b over the organic light-emitting diode OLED. The thickness $t_1$ of the first capping area 251a may be set to be about 1.1 times to about 10 times greater than the thickness $t_2$ of the second capping area 251b.

A wavelength of the infrared ray is greater than that of the visible ray. Therefore, when the thickness $t_1$ of the first capping area 251a is greater than the thickness $t_2$ of the second capping area 251b, a resonant effect of the infrared ray may be improved and the infrared ray transmittance may increase.

In addition, the refractive index of the capping layer 251 may be set in a range of 1.79 to 2.2 in order to improve the infrared ray transmittance of the transmission area TA.

The capping layer 251 may include at least one selected from the group consisting of, for example, tris-8-hydroxyquinoline aluminum ($Alq_3$), ZnSe, 2, 5-bis(6'-(2',2"-bipyidyl))-1, 1-dimethyl-3,4-diphenylsilole, 4'-bis[N-(1-napthyl)-N-phenyl-amion] biphenyl (a-NPD), N,N'-diphenyl-N,N'-bis(3-methylphenyl)-1,1'biphenyl-4,4'-diamine (TPD), and 1,1'-bis(di-4-tolylaminophenyl) cyclohexane (TAPC).

In order to improve the light extraction in the resonant structure, an appropriate degree of light reflection has to occur. In addition, when a difference in refractive indices between the capping layer 251 and the thin film encapsulation layer 300 is not large, the light may not be sufficiently reflected at an interface and the resonance may not appropriately occur. Therefore, a light extraction layer 253 having a low refractive index may be disposed between the capping layer 251 and the thin film encapsulation layer 300 to increase the difference in the refractive indices.

The light extraction layer 253 may include a light transmitting material. Also, the refractive index of the light extraction layer 253 may be different from the refractive index of the capping layer 251 or the refractive index of the thin film encapsulation layer 300. For example, in an embodiment, a difference in the refractive indices between the first inorganic encapsulation layer 310 and the light extraction layer 253 may be set to be greater than or equals to about 0.46.

Also, the light extraction layer 253 may include at least one selected from the group consisting of $CaF_2$, NaF, $Na_3AlF_6$, SiOx, $AlF_3$, LiF, $MgF_2$, and $IF_3$.

The light extraction layer 253 may satisfy a condition of equation above, that is, $n*d=\lambda/4$, in order to form a resonant structure. In an embodiment, the light extraction layer 253 includes a first light extraction area 253a disposed over the transmission area TA and a second light extraction area 253b disposed over the organic light-emitting diode OLED, and a thickness of the first light extraction area 253a may be greater than a thickness of the second light extraction area 253b as disclosed in FIG. 6.

The infrared ray emitted from the component 20 has a longer wavelength than that of the visible ray emitted from the emission layer. Therefore, in order to form the resonant structure in the transmission area TA, the thickness of the first light extraction area 253a may be set to be greater than that of the second light extraction area 253b. In an embodiment, the thickness of the first light extraction area 253a may be set to be about twice to about ten times greater than that of the second light extraction area 253b.

In the display apparatus 1 according to the embodiment, the thin film encapsulation layer 300 is disposed on the light extraction layer 253. The thin film encapsulation layer 300 may include at least one inorganic encapsulation layer and at least one organic encapsulation layer, and regarding this, FIG. 5 shows a structure of the thin film encapsulation layer 300, in which a first inorganic encapsulation layer 310, an organic encapsulation layer 320, and a second inorganic encapsulation layer 330 are stacked. In another embodiment, a stacking order and the number of organic and inorganic encapsulation layers may vary.

The first and second inorganic encapsulation layers 310 and 330 may include one or more inorganic insulating materials such as aluminum oxide, titanium oxide, tantalum oxide, hafnium oxide, zinc oxide, silicon oxide, silicon nitride, and silicon oxynitride, and may be manufactured by a chemical vapor deposition (CVD) method, etc. The organic encapsulation layer 320 may include a polymer-based material. The polymer-based material may include a silicon-based resin, an acryl-based resin, an epoxy-based resin, polyimide, polyethylene, etc.

Each of the first inorganic encapsulation layer 310, the organic encapsulation layer 320, and the second inorganic encapsulation layer 330 may be integrally formed to cover the display area DA and the sensor area SA.

The first inorganic encapsulation layer 310 may include a material having a high refractive index for making the resonant effect. Also, in order to increase the transmittance in the transmission area TA, a difference in the refractive indices between the capping layer 251 and the light extraction layer 253 has to increase. In addition, a difference in the refractive indices between the first inorganic encapsulation layer 310 and the light extraction layer 253 has to increase. The difference in the refractive indices between the capping layer 251 and the light extraction layer 253 may be greater than or equals to about 0.5. In addition, the difference in the refractive indices between the first inorganic encapsulation layer 310 and the light extraction layer 253 may be greater than or equals to 0.46.

Also, the light extraction layer 253 may include the first light extraction area 253a disposed over the transmission area TA and the second light extraction area 253b disposed over the organic light-emitting diode OLED.

As described above, the first capping area 251a and the first light extraction area 253a may be referred to as the second stack structure 250a. Also, the second capping area 251b and the second light extraction area 253b may be referred to as the first stack structure 250b.

The infrared ray emitted from the component 20 in the transmission area TA has a longer wavelength than that of the visible ray emitted from the emission layer 222b and 222b'. Therefore, in order to improve the transmittance of the infrared ray in the transmission area TA by using the resonant effect, a thickness of the second stack structure 250a may be greater than a thickness of the first stack structure 250b.

Figure 6:
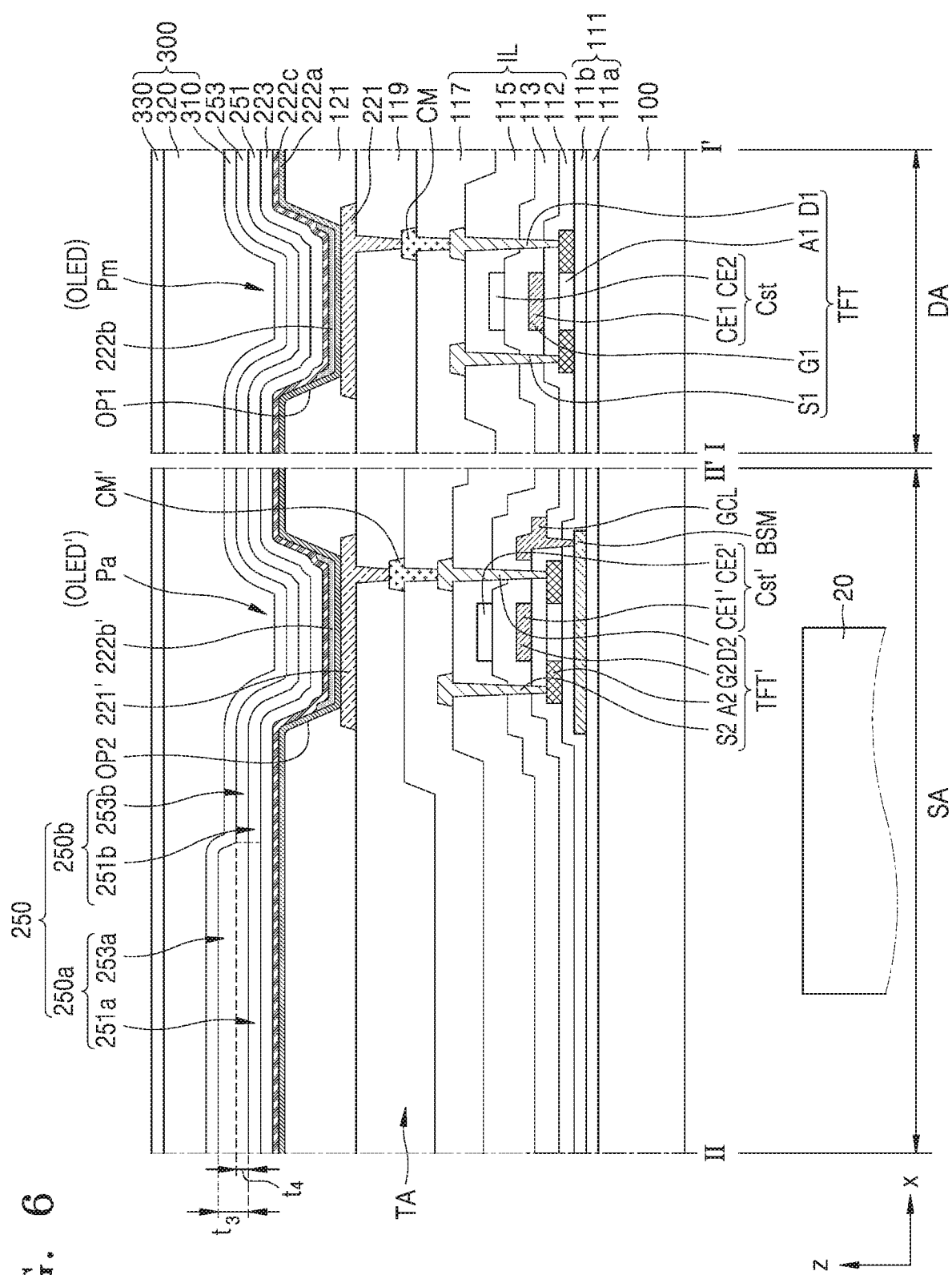
FIG. 6 is a cross-sectional view of a display apparatus according to another embodiment.

FIG. 6 is a cross-sectional view of a display apparatus according to another embodiment. In FIG. 6, like reference numerals as those of FIG. 5 denote the same elements, and detailed descriptions thereof are omitted.

Referring to FIG. 6, the display apparatus according to the embodiment includes the substrate 100, the first stack structure 250b disposed over the plurality of display element layers, and the second stack structure 250a covering the transmission area TA, wherein the substrate 100 includes the display area DA and the sensor area SA which includes the transmission area TA.

A thickness $t_3$ of the first light extraction area 253a may be set to improve a transmittance of the infrared ray that is emitted from the component 20 of the transmission area TA. Also, a thickness $t_4$ of the second light extraction area 253b may be set to improve a transmittance of the visible ray that is emitted from the first emission layer 222b and the second emission layer 222b'. Therefore, the thickness $t_3$ of the first light extraction area 253a may be different from the thickness $t_4$ of the second light extraction area 253.

The thickness $t_3$ of the first light extraction area 253a may be greater than or equals to about 50 nm and less than or equals to about 220 nm. For example, the thickness $t_3$ of the first light extraction area 253 may be greater than or equals to about 170 nm and less than or equals to about 220 nm.

The thickness $t_1$ of the first capping area 251a may be different from the thickness $t_2$ of the second capping area 251b, and at the same time, the thickness $t_3$ of the first light extraction area 253a may be different from the thickness $t_4$ of the second light extraction area 253b. The thickness $t_1$ of the first capping area 251a and the thickness $t_3$ of the first light extraction area 253a may be set to increase the resonant effect of the infrared ray transmitting through the transmission area TA.

In this case, the thickness $t_1$ of the first capping area 251a may be greater than or equals to about 50 nm and less than or equals to about 150 nm and thickness $t_3$ of the first light extraction area 253a may be greater than or equals to about 20 nm and less than or equals to about 220 nm. Preferably, the thickness $t_1$ of the first capping area 251a may be greater than or equals to about 90 nm and less than or equals to about 150 nm, the thickness t2 of the second capping area 251b may be greater than or equals to about 60 nm and less than or equals to about 85 nm, the thickness $t_3$ of the first light extraction area 253a may be greater than or equals to about 50 nm and less than or equals to about 220 nm, and the thickness t4 of the second light extraction area 253b may be greater than or equals to about 10 nm and less than or equals to about to 40 nm.

The refractive indices of the capping layer 251 and the light extraction layer 253 may be altered as needed. When the refractive index of the capping layer 251 is changed, the transmittance of the visible ray emitted from the main pixels Pm in the display area DA and the auxiliary pixels Pa in the sensor area SA may be changed.

Even when the refractive index of the capping layer 251 is changed, the changed degree of the refractive index of the visible ray emitted from the main pixels Pm in the display area DA and the auxiliary pixels Pa in the sensor area SA may be ignorable provided that the refractive index of the capping layer 251 is within a range of 1.79 to 2.2. Therefore, when the refractive index of the capping layer 251 is within the range of 1.79 to 2.2, the transmittance of the infrared ray passing through the transmission area TA may be improved while maintaining the transmittance of the visible ray.

Figure 7A:
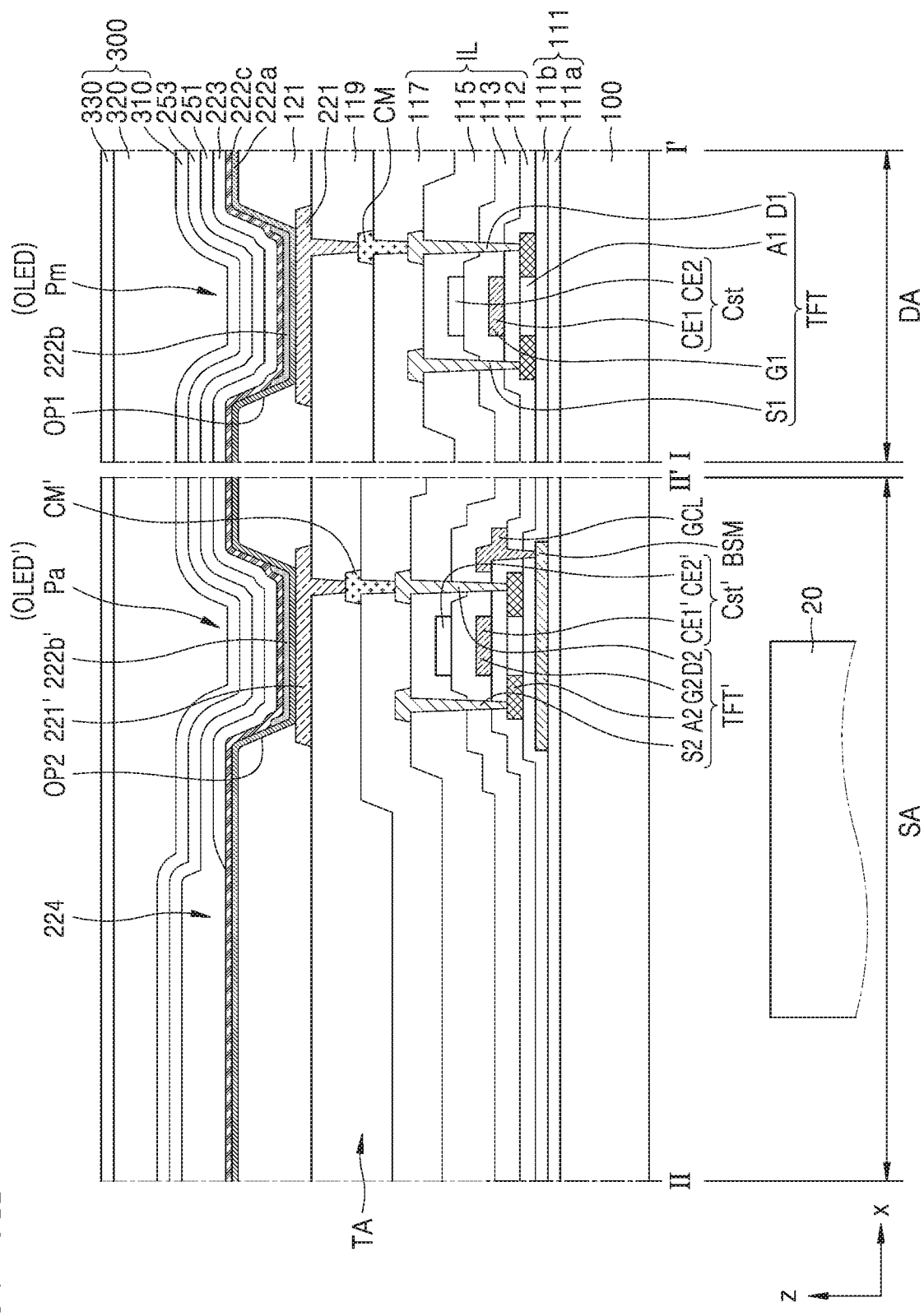
FIG. 7A is a cross-sectional view of a display apparatus according to another embodiment.
Figure 7B:
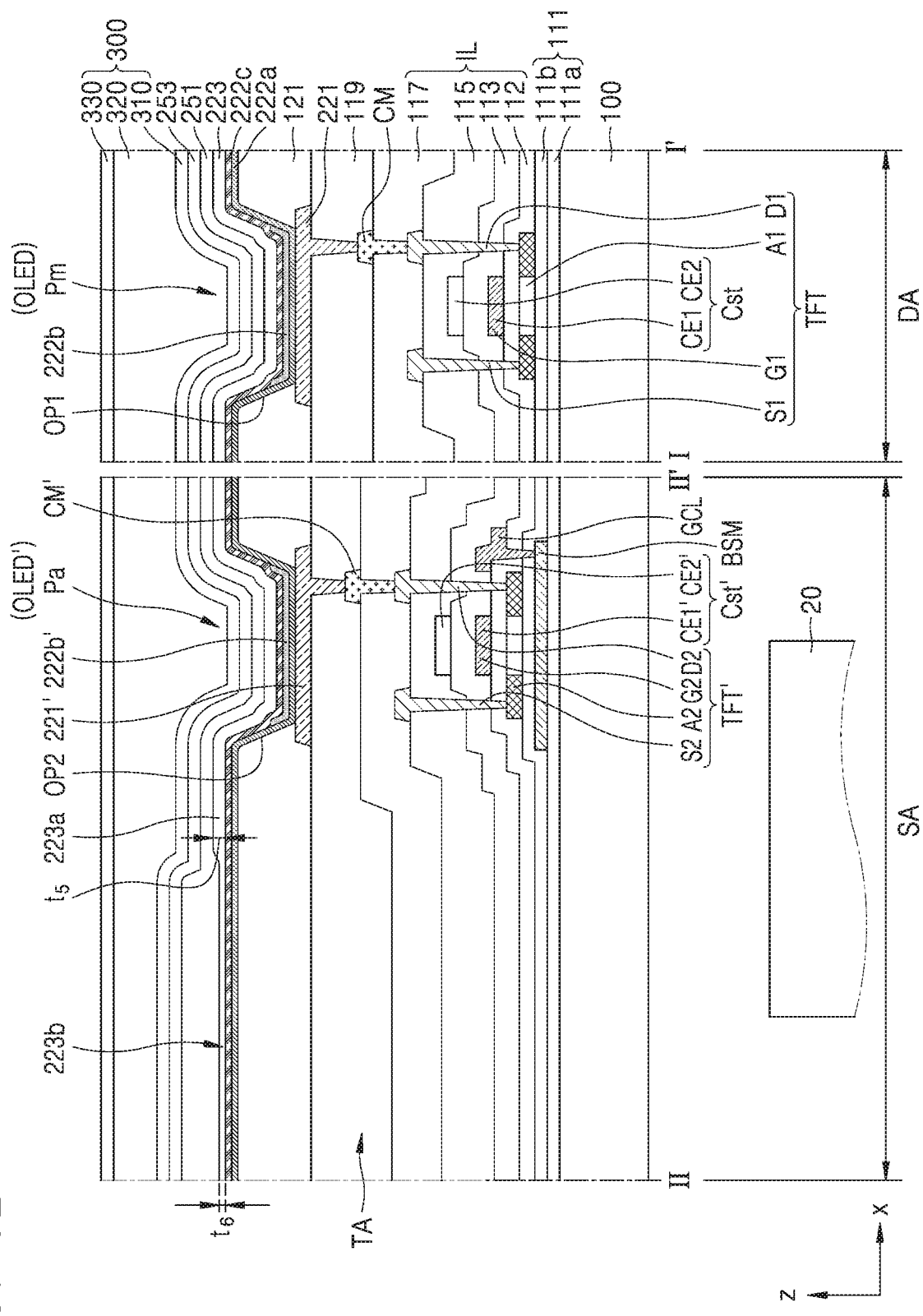
FIG. 7B is a cross-sectional view of a display apparatus according to another embodiment.

FIGS. 7A and 7B are cross-sectional views of display apparatuses according to another embodiments. In FIGS. 7A and 7B, like reference numerals as those of FIG. 5 denote the same elements, and detailed descriptions thereof are omitted.

Referring to FIG. 7A, the display apparatus according to the embodiment includes the substrate 100, the first stack structure 250b over the plurality of display element layers, and the second stack structure 250a covering the transmission area TA, wherein the substrate 100 includes the display area DA and the sensor area SA which includes the transmission area TA.

The plurality of display element layers may include the opposite electrode 223 integrally provided throughout the plurality of display element layers 200 and formed in a single piece. In addition, the opposite electrode 223 may include an opening 224 disposed corresponding to the transmission area TA.

When the opening 224 is disposed over the transmission area TA to overlap the transmission area TA, the transmittance of the infrared ray emitted from the component 20 may be improved. Also, a signal from the component 20 may be sufficiently and precisely processed.

Referring to FIG. 7B, the display apparatus according to the embodiment includes the substrate 100, the first stack structure 250b over the plurality of display element layers, and the second stack structure 250a covering the transmission area TA, wherein the substrate 100 includes the display area DA and the sensor area SA which includes the transmission area TA.

The display element layers may include the opposite electrode 223 integrally included in the plurality of display element layers 200. The opposite electrode 223 may include a first area 223a disposed corresponding to the plurality of display element layers 200 and a second area 223b disposed corresponding to the transmission area TA. Also, a thickness $t_6$ of the second area 223b may be less than a thickness $t_5$ of the first area 223a.

When the thickness of the opposite electrode 223 over the transmission area TA increases, the transmittance may degrade. When the thickness $t_6$ of the second area 223b is less than the thickness $t_5$ of the first area 223a, the transmittance of the infrared ray emitted from the component 20 may be improved. Also, a signal from the component 20 may be sufficiently and precisely processed.

Figure 8:
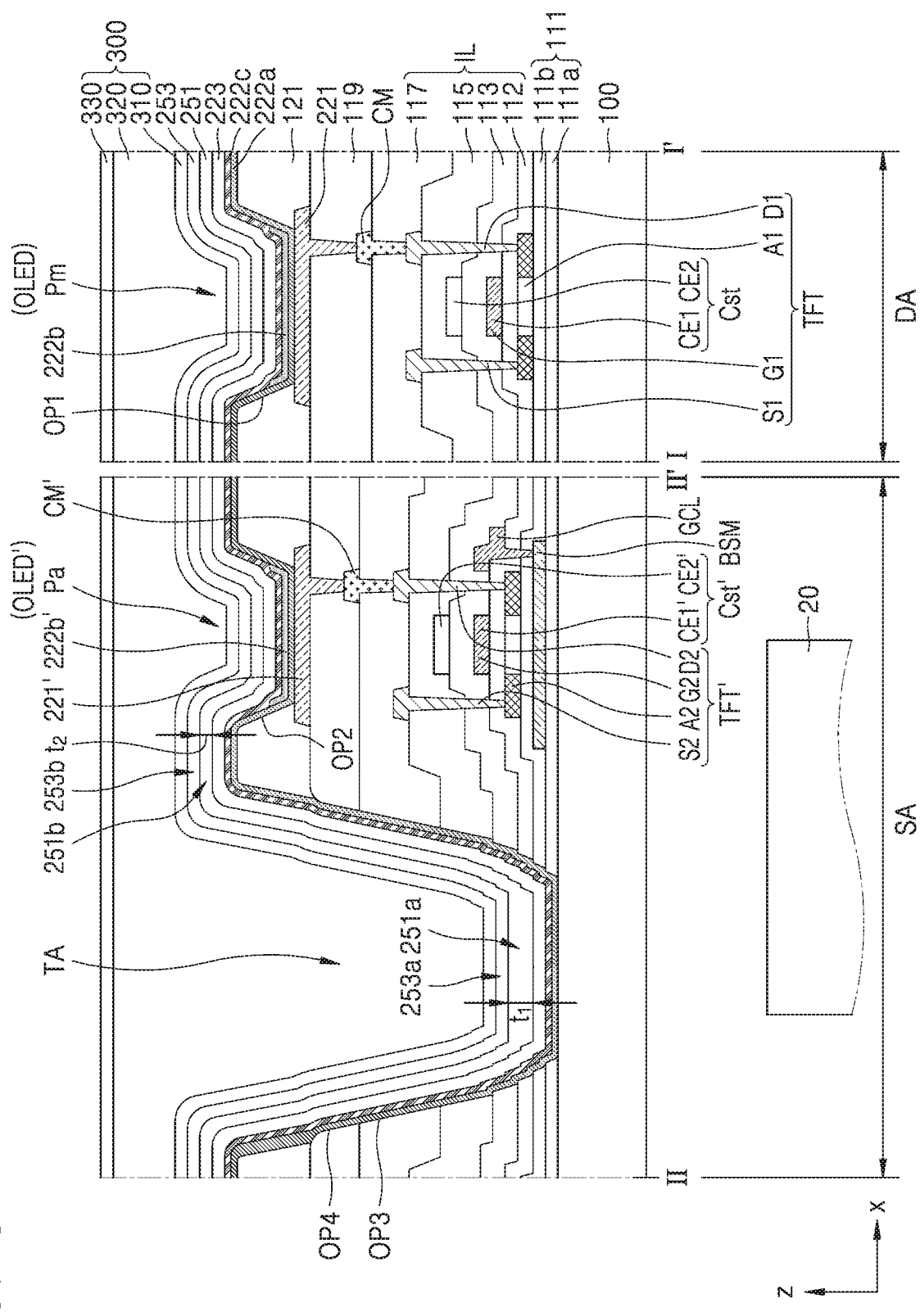
FIG. 8 is a cross-sectional view of a display apparatus according to another embodiment.

FIG. 8 is a cross-sectional view of a display apparatus according to another embodiment. In FIG. 8, like reference numerals as those of FIG. 5 denote the same elements, and detailed descriptions thereof are omitted.

Referring to FIG. 8, the display apparatus according to the embodiment includes the substrate 100, the first stack structure 250b over the plurality of display element layers, and the second stack structure 250a covering the transmission area TA, wherein the substrate 100 includes the display area DA and the sensor area SA which includes the transmission area TA.

The inorganic insulating layer IL, the planarization layer 119, and the pixel defining layer 121 may be between the substrate 100 and the plurality of display element layers. At least one of the inorganic insulating layer IL, the planarization layer 119, and the pixel defining layer 121 may include an opening or a groove corresponding to the transmission area TA.

Referring to FIG. 8, the inorganic insulating layer IL may include an inorganic insulating layer opening OP3. The inorganic insulating layer opening OP3 may expose an upper surface of the buffer layer 111 or the substrate 100. The inorganic insulating layer opening OP3 may overlap a first opening of the first gate insulating layer 112, a second opening of the second gate insulating layer 113, a third opening of the first interlayer insulating layer 115, and a fourth opening of the second interlayer insulating layer 117, wherein the first to fourth openings are disposed correspond to the transmission area TA. The first to fourth openings may be separately formed through separate processes, or may be simultaneously formed through one process. Alternatively, the first to third openings may be simultaneously formed and the fourth opening may be separately formed. When the first to fourth openings are obtained through separate processes, a step may be generated on a side surface of the inorganic insulating layer opening OP3.

Alternatively, the inorganic insulating layer IL may include a groove which does not expose the buffer layer 111. For example, the first gate insulating layer 112 and the second gate insulating layer 113 in the inorganic insulating layer IL may successively arranged in an area corresponding to the transmission area TA, and the first interlayer insulating layer 115 and the second interlayer insulating layer 117 may respectively include the third opening and the fourth opening disposed corresponding to the transmission area TA.

Alternatively, the first gate insulating layer 112 may be disposed in an area correspond to the transmission area TA, and the second gate insulating layer 113, the first interlayer insulating layer 115, and the second interlayer insulating layer 117 may include the second to fourth openings disposed corresponding to the transmission area TA.

In another embodiment, the inorganic insulating layer IL may not include the inorganic insulating layer opening OP3 corresponding to the transmission area TA. Since the inorganic insulating layer IL may have the transmittance of the light that may be emitted from/received by the component 20, and may not include the opening (inorganic insulating layer opening OP3) corresponding to the transmission area TA.

Also, the planarization layer 119 and the pixel defining layer 121 may include an organic insulating layer opening OP4. The inorganic insulating layer opening OP4 may overlap the inorganic insulating layer opening OP3.

The second stack structure 250a may be in the inorganic insulating layer opening OP3 or the organic insulating layer opening OP3.

Because organic and inorganic stack structures on the substrate 100 in the transmission area TA is removed, the signal from the component 20 may be processed precisely.

Figure 9:
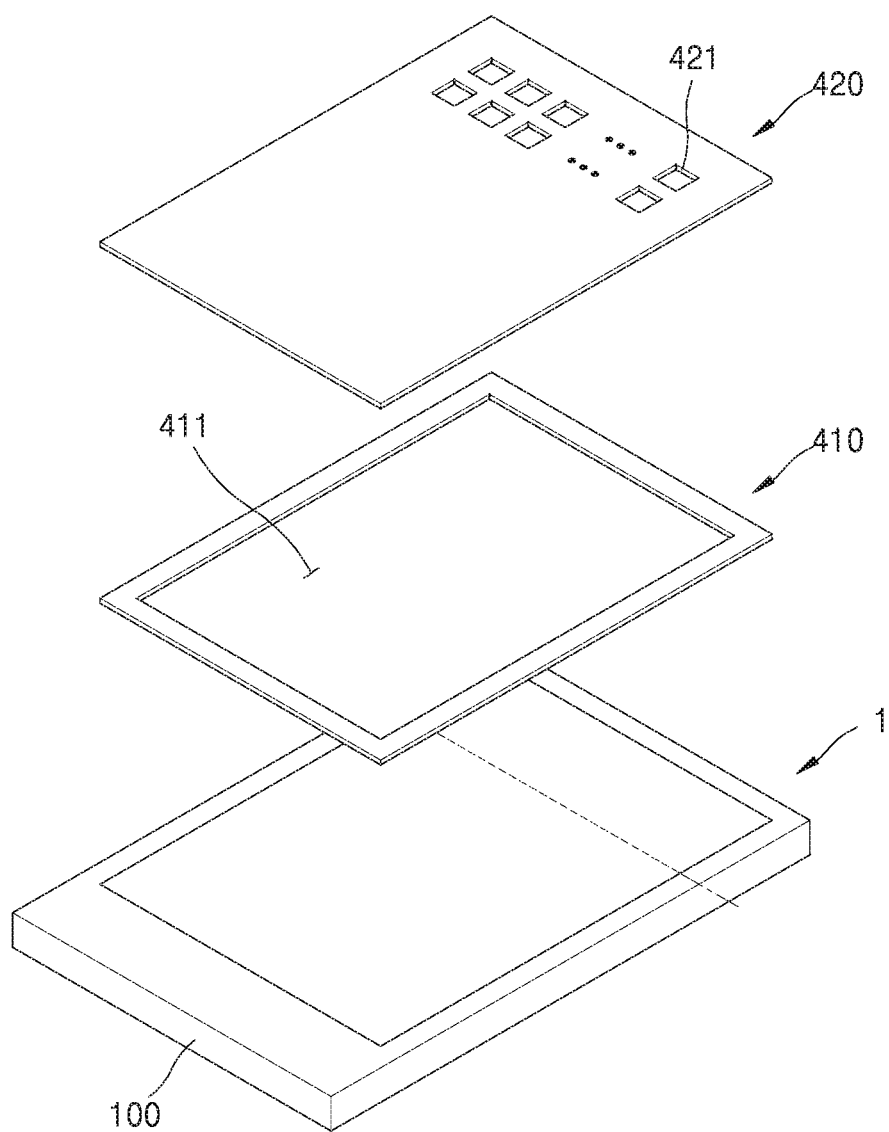
FIG. 9 is a perspective view of a first mask and a second mask for manufacturing a stack structure of FIG. 5.

FIG. 9 shows a first mask 410 and a second mask 420 for manufacturing the first stack structure 250b and the second stack structure 250a included in the display apparatus 1.

The first mask 410 includes an open region 411 corresponding to entire display area DA.

The second mask 420 includes pattern holes 421 formed in regions corresponding to the transmission area TA. Therefore, the second stack structure 250a is formed only on the transmission area TA. However, one or more embodiments are not limited thereto. The pattern holes 421 in the second mask 420 may be variously modified.

Figure 10A:
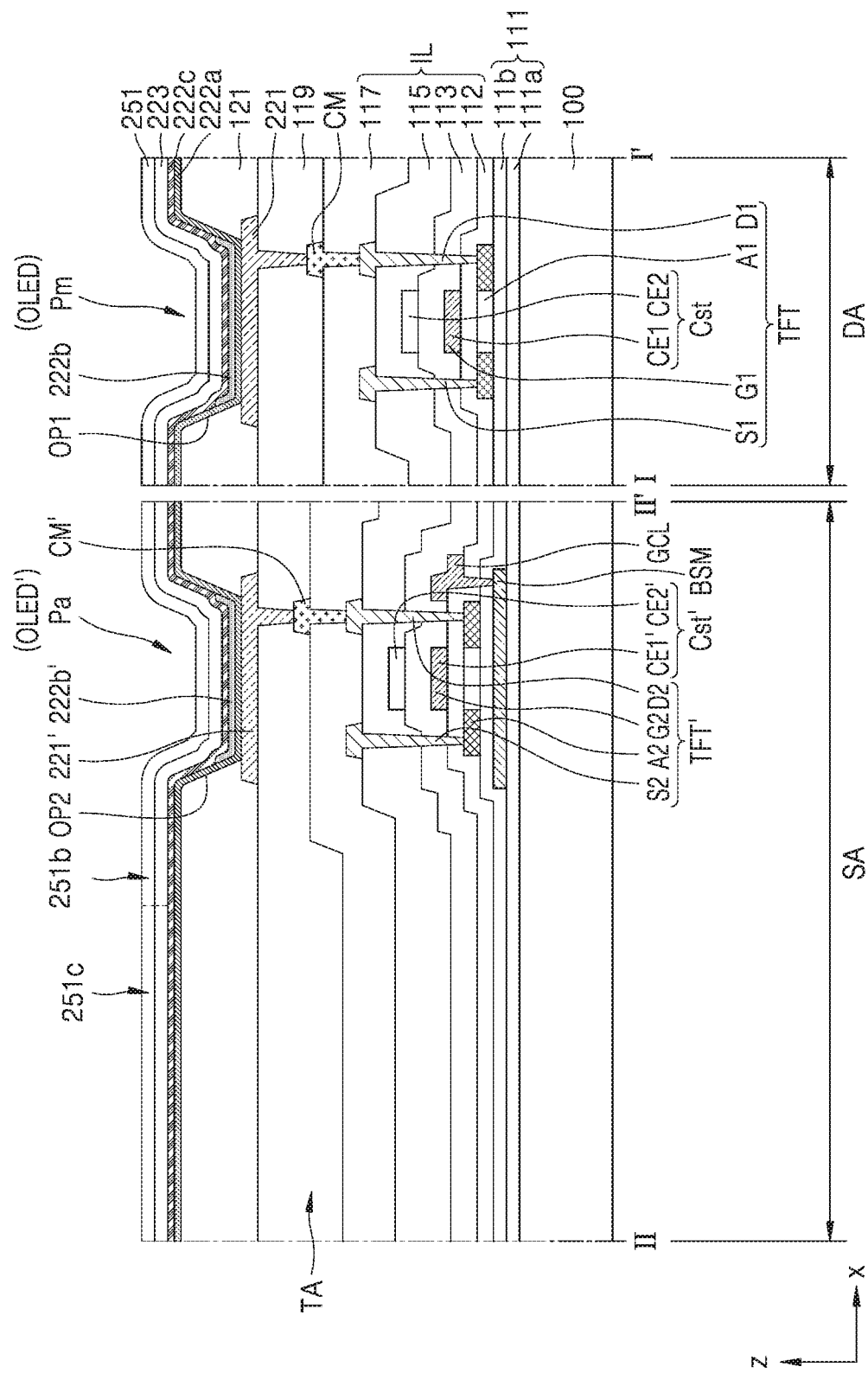
FIG. 10A is a cross-sectional view illustrating processes in a method of manufacturing a display apparatus, according to an embodiment.
Figure 10B:
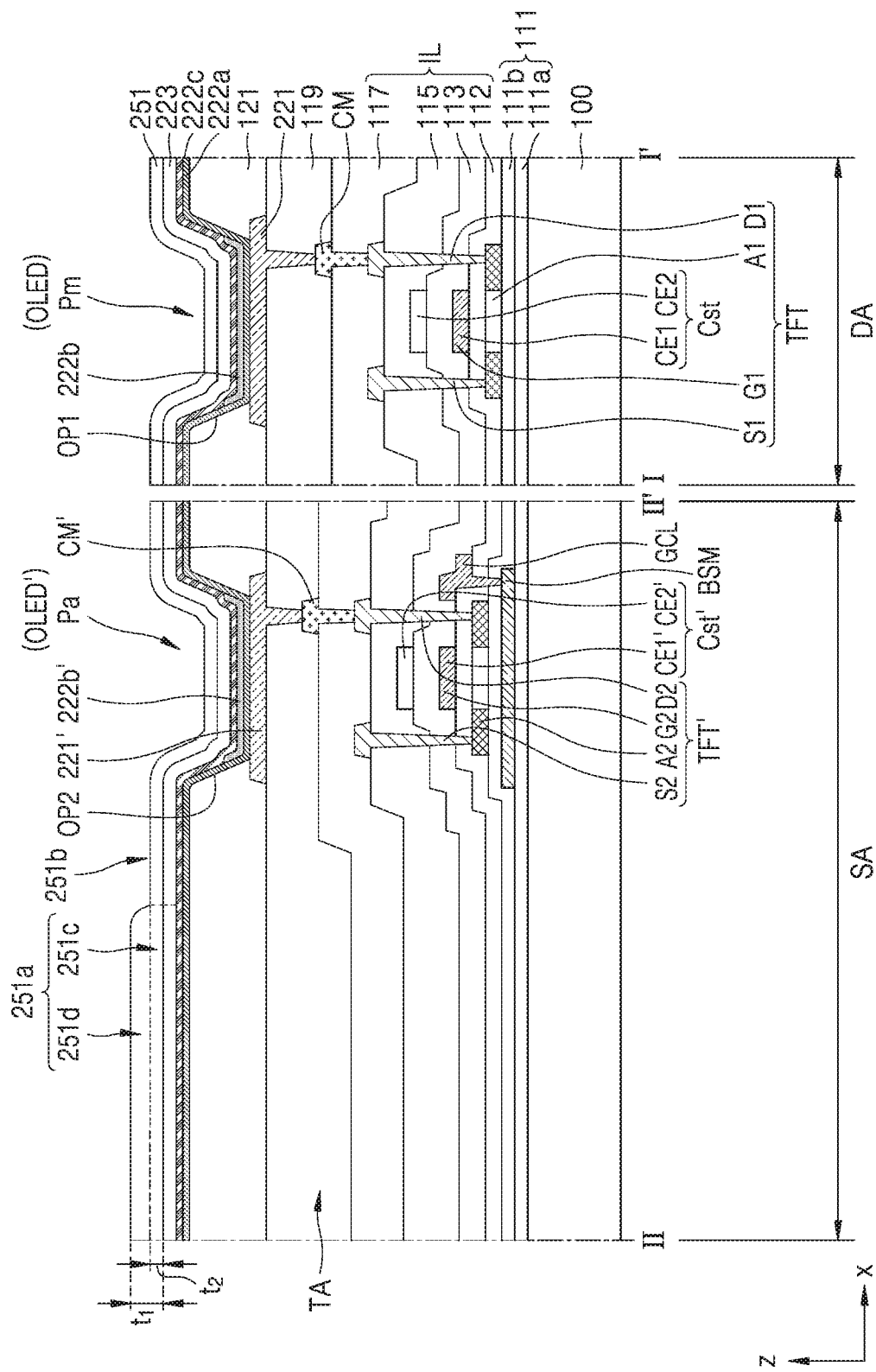
FIG. 10B is a cross-sectional view illustrating processes in a method of manufacturing a display apparatus, according to an embodiment.

FIGS. 10A and 10B are cross-sectional views illustrating a method of manufacturing the display apparatus 1 in a processing order, according to an embodiment.

Referring to FIG. 10A, the second capping area 251b and a first auxiliary capping layer 251c may be obtained by using the first mask 410 of FIG. 9. The first auxiliary capping layer 251c may have a thickness that is equal to that of the second capping area 251b.

Referring to FIG. 10B, a second auxiliary capping layer 251d may be obtained by using the second mask 420 of FIG. 9. The first capping area 251a may include the first auxiliary capping layer 251c and the second auxiliary capping layer 251d. Since the pattern holes 421 in the second mask 420 are arranged to correspond to the second auxiliary capping layer 251d may be exclusively formed on the transmission area TA. Thus, the thickness $t_1$ of the first capping area 251a and the thickness $t_2$ of the second capping area 251b having different thicknesses may be formed.

In the same manner as above, the light extraction layer 253 that has regions of different thicknesses and the first inorganic encapsulation layer 310 that has regions of different thicknesses may be obtained by using the second mask 420.

Hereinafter, a variation in the infrared ray transmittance will be described in detail based on simulation results.

Figure 11A:
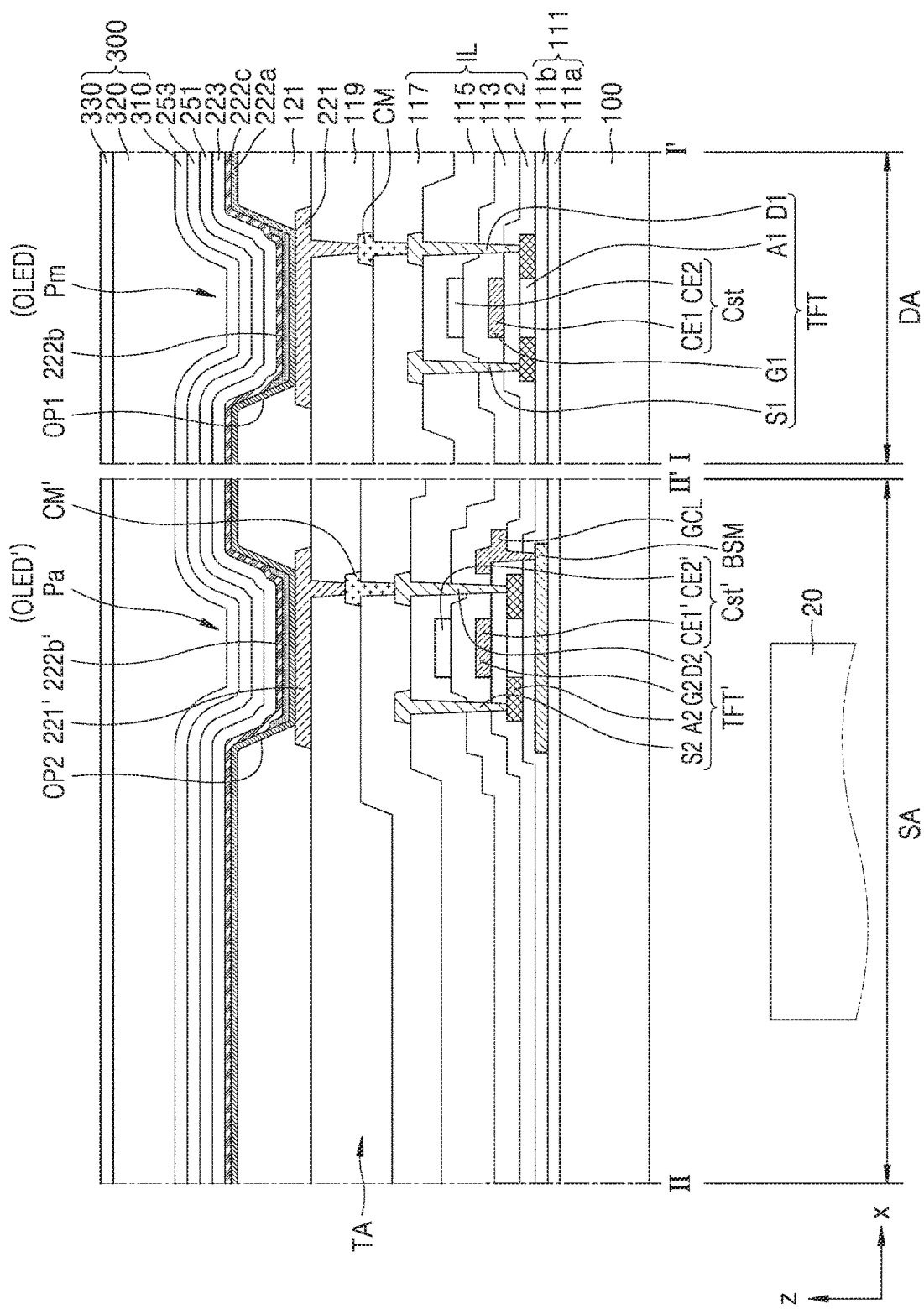
FIG. 11A is a cross-sectional view according to a comparative example for comparison with an embodiment.

FIG. 11A shows a cross-sectional view of a conventional display apparatus in which the stack structure in the transmission area TA is the same to that in the display area DA and the auxiliary pixel area.

In the conventional display apparatus, the capping layer 251 has a refractive index of 1.79 and a thickness of 83 nm. Also, the light extraction layer 253 has a refractive index of 1.29 and a thickness of 20 nm. The light extraction layer 253 may include LiF. The first inorganic encapsulation layer 310 has a thickness of 1025 nm and a refractive index of 1.75.

[Case 1]

Figure 11B:
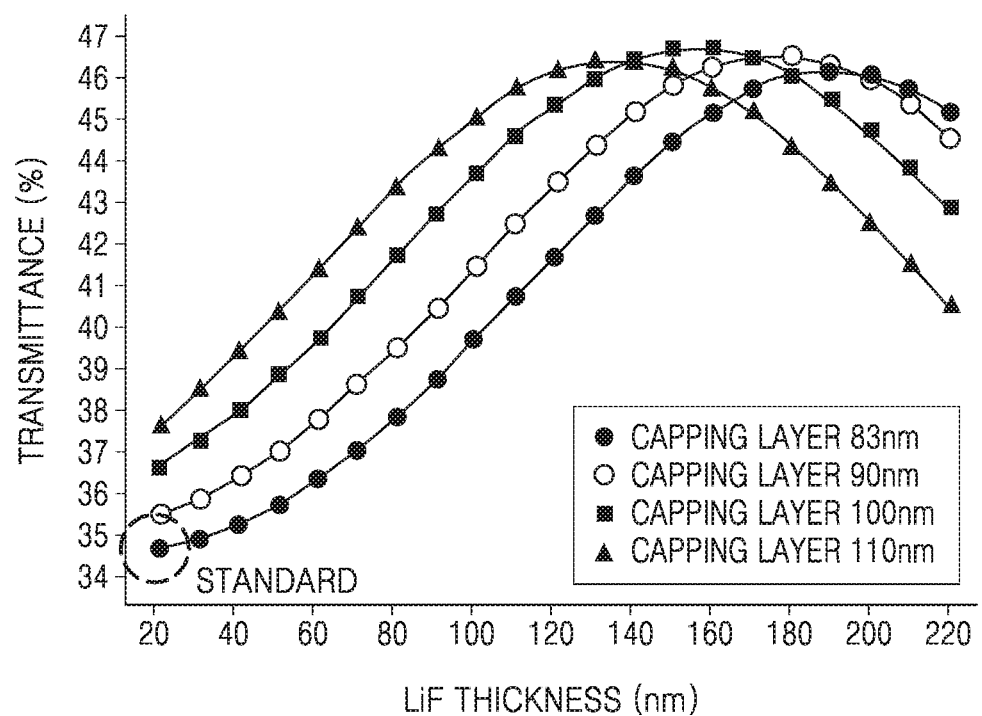
FIG. 11B is a diagram showing an example of an infrared ray transmittance of a transmitting portion included in the display apparatus of FIG. 5.

FIG. 11B is a graph showing the infrared ray transmittance that was measured while changing the thickness $t_1$ of the first capping area 251a into one of 83 nm, 90 nm, 100 nm, and 110 nm and changing the thickness $t_3$ of the first light extraction area 253a.

When the thickness $t_1$ of the first capping area 251a and the thickness $t_3$ of the first light extraction area 253a were changed, the infrared ray transmittance was improved up to by 12.21% when the thickness $t_1$ of the first capping area 251a was 100 nm and the thickness $t_3$ of the first light extraction area 253a was 160 nm as compared to the conventional display apparatus disclosed in paragraph [00187] above.

[Case 2]

Figure 11C:
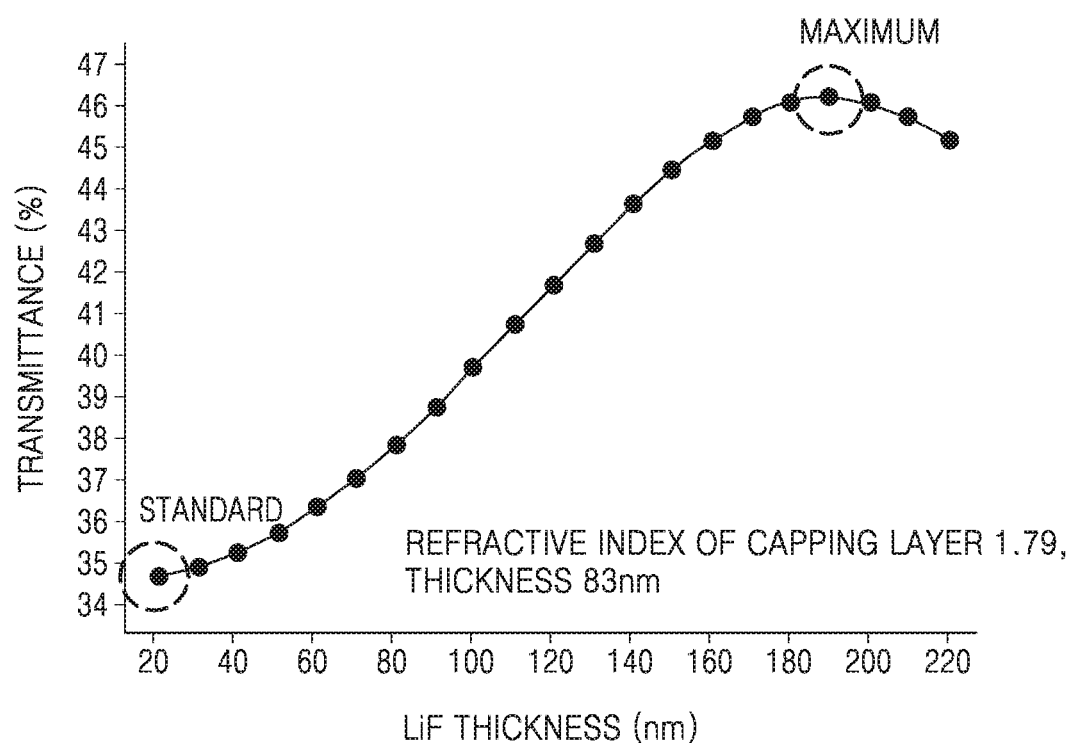
FIG. 11C is a diagram showing an example of an infrared ray transmittance of a transmitting portion included in the display apparatus of FIG. 6.

FIG. 11C is a graph showing the infrared ray transmittance according to the thickness $t_3$ of the first light extraction area 253a when the thickness $t_1$ of the first capping area 251a is 83 nm and the refractive index of the capping layer 251 is 1.79.

The infrared ray transmittance was improved up to by 11.68% as compared to the conventional display apparatus disclosed in paragraph [00187] above, when the thickness $t_3$ of the first light extraction area 253a is 200 nm.

[Case 3]

Figure 11D:
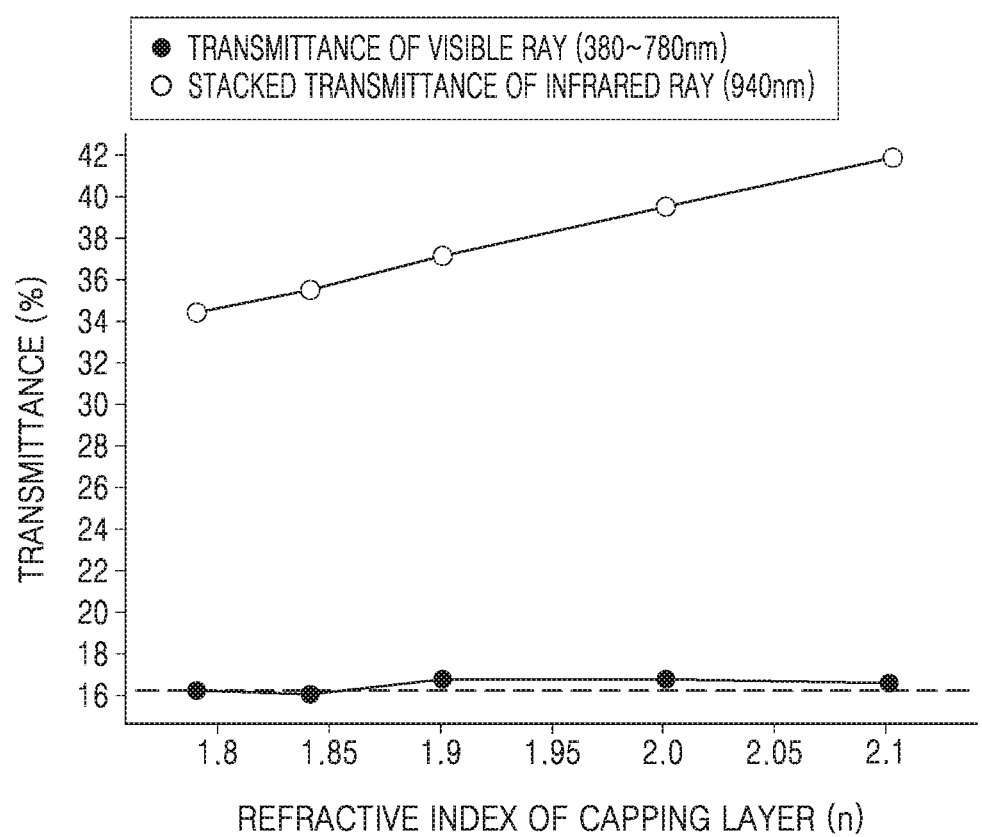
FIG. 11D is a diagram showing examples of an infrared ray transmittance of a transmitting portion and a visible ray transmittance of a display area in the display apparatus of FIG. 5.

FIG. 11D is a graph showing a visible ray transmittance and infrared ray transmittance measured while changing the refractive index of the capping layer 251 to 1.79, 1.84, 1.9, 2.0, and 2.1 when the refractive index of the light extraction layer 253 is 1.29 and the thickness $t_3$ of the first light extraction area 253a is 20 nm.

While the refractive index of the capping layer 251 increased from 1.79 to 2.1, the infrared ray transmittance of the transmission area TA was improved up to by 7.57%, whereas the visible ray transmittance of the display area DA was maintained constantly at about 16%.

According to the display apparatus of the embodiments, a pixel portion and a transmission area having an improved light transmittance are arranged in the sensor area corresponding to a component such as a sensor, etc., and thus, an image may be realized on a region overlapping the component simultaneously with providing an environment in which the component may operate.

Accordingly, the display apparatus having various functions and improved quality may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate comprising a display area and a sensor area, the display area comprising main pixels and the sensor area comprising auxiliary pixels and a transmission area;
a plurality of display elements included in each of the main pixels and each of the auxiliary pixels;
a first stack structure overlapping the plurality of display elements;
a second stack structure overlapping the transmission area; and
a thin film encapsulation layer covering the first stack structure and the second stack structure,
wherein the first stack structure has a thickness that is different from a thickness of the second stack structure,
each of the first stack structure and the second stack structure comprises a capping layer and a light extraction layer disposed on the capping layer,
the thin film encapsulation layer is disposed on the light extraction layer and comprises a first inorganic encapsulation layer, and
a refractive index of the light extraction layer is less than a refractive index of the capping layer and a refractive index of the first inorganic encapsulation layer.

2. The display apparatus of claim 1, wherein
the capping layer comprises a first capping area disposed over the transmission area and a second capping area disposed over the plurality of display elements, and
the first capping area has a thickness greater than a thickness of the second capping area.

3. The display apparatus of claim 2, wherein
the thickness of the first capping area is greater than or equals to about 1.1 times and less than or equals to 10 times of the thickness of the second capping area.

4. The display apparatus of claim 2, wherein
the light extraction layer comprises a first light extraction area disposed over the transmission area and a second light extraction area disposed over the plurality of display elements, and
the first light extraction area has a thickness greater than a thickness of the second light extraction area.

5. The display apparatus of claim 2, wherein
the light extraction layer comprises a first light extraction area disposed over the transmission area and a second light extraction area disposed over the plurality of display elements,
a thickness of the first capping area is greater than or equals to about 90 nm and less than or equals to about 150 nm,
a thickness of the second capping area is greater than or equals to about 60 nm and less than or equals to about 85 nm,
a thickness of the first light extraction area is greater than or equals to about 50 nm and less than or equals to about 220 nm, and
a thickness of the second light extraction area is greater than or equals to about 10 nm and less than or equals to about 40 nm.

6. The display apparatus of claim 1, wherein
the light extraction layer comprises a first light extraction area disposed over the transmission area and a second light extraction area disposed over the plurality of display elements, and
the first light extraction area has a thickness greater than a thickness of the second light extraction area.

7. The display apparatus of claim 6, wherein
the thickness of the first light extraction area is about twice to about ten times greater than the thickness of the second light extraction area.

8. The display apparatus of claim 1, wherein
a difference between the refractive index of the capping layer and the refractive index of the light extraction layer is greater than or equals to about 0.5, and
a difference between the refractive index of the first inorganic encapsulation layer and the refractive index of the light extraction layer is greater than or equals to about 0.46.

9. The display apparatus of claim 1, wherein
the capping layer comprises a first capping area disposed over the transmission area and a second capping area disposed over the plurality of display elements,
the light extraction layer comprises a first light extraction area disposed over the first capping area and a second light extraction area disposed over the second capping area, and
the refractive index of the capping layer is greater than or equals to about 1.79 and less than or equals to about 2.2.

10. The display apparatus of claim 1, wherein
the plurality of display elements comprise an opposite electrode formed in a single piece to cover the plurality of display elements, and the opposite electrode comprises an opening disposed corresponding to the transmission area.

11. The display apparatus of claim 1,
wherein
the plurality of display elements comprise an opposite electrode formed in a single piece to cover the plurality of display elements, and
the opposite electrode comprises a first area disposed corresponding to the plurality of display elements and a second area disposed corresponding to the transmission area, the second area having a thickness that is less than a thickness of the first area.

12. The display apparatus of claim 1,
wherein an inorganic insulating layer and an organic insulating layer are disposed between the substrate and the plurality of display elements, at least one of the inorganic insulating layer and the organic insulating layer comprises an opening or a groove disposed corresponding to the transmission area, and the second stack structure is in the opening or the groove.

13. The display apparatus of claim 1, further comprising an infrared ray sensor on a lower surface of the substrate, the infrared ray sensor being disposed corresponding to the sensor area.

14. The display apparatus of claim 1, further comprising a lower electrode layer below an auxiliary pixel, the lower electrode layer being disposed corresponding to the auxiliary pixel.

15. A display apparatus comprising:
a substrate comprising a transmission area and a display area surrounding the transmission area;
a plurality of display elements in the display area;
a thin film encapsulation layer covering the transmission area and the plurality of display elements;
a capping layer disposed between the plurality of display elements and the thin film encapsulation layer to cover the transmission area; and
a light extraction layer disposed between the capping layer and the thin film encapsulation layer,
wherein at least one of the capping layer and the light extraction layer disposed in a region corresponding to the transmission area has a greater thickness than a region disposed corresponding to the plurality of display elements, and
a refractive index of the light extraction layer is less than a refractive index of the capping layer and a refractive index of the thin film encapsulation layer.

16. The display apparatus of claim 15, wherein
the thin film encapsulation layer comprises a first inorganic encapsulation layer, and
a refractive index of the light extraction layer is less than a refractive index of the capping layer and a refractive index of the first inorganic encapsulation layer.

17. The display apparatus of claim 15, wherein
the capping layer comprises a first capping area disposed over the transmission area and a second capping area disposed over the plurality of display elements, and
the first capping area has a thickness greater than a thickness of the second capping area.

18. The display apparatus of claim 15, wherein
the light extraction layer comprises a first light extraction area disposed over the transmission area and a second light extraction area disposed over the plurality of display elements, and
the first light extraction area has a thickness greater than a thickness of the second light extraction area.

19. The display apparatus of claim 15, wherein
the plurality of display elements comprise an opposite electrode formed in a single piece to cover the plurality of display elements, and
the opposite electrode comprises a first area disposed corresponding to the plurality of display elements and a second area disposed corresponding to the transmission area, the second area having a thickness less than a thickness of the first area.

\* \* \* \* \*